United States Patent
Origasa

(10) Patent No.: US 6,487,138 B2
(45) Date of Patent: Nov. 26, 2002

(54) SEMICONDUCTOR MEMORY

(75) Inventor: Kenichi Origasa, Takatsuki (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/870,467

(22) Filed: Jun. 1, 2001

(65) Prior Publication Data

US 2001/0050877 A1 Dec. 13, 2001

(30) Foreign Application Priority Data

Jun. 1, 2000 (JP) ........................... 2000-163854

(51) Int. Cl.⁷ ................................................. G11C 7/00
(52) U.S. Cl. .................. 365/230.06; 365/230.01; 365/189.01; 365/189.11
(58) Field of Search ................ 365/230.01, 230.06, 365/189.01, 189.11, 230.03

(56) References Cited

U.S. PATENT DOCUMENTS

| | | | |
|---|---|---|---|
| 5,838,629 A | 11/1998 | Kohno | 365/230.06 |
| 6,025,751 A * | 2/2000 | Chiang et al. | 327/589 |
| 6,031,781 A * | 2/2000 | Tsuji et al. | 365/227 |
| 6,088,286 A * | 7/2000 | Yamauchi et al. | 365/230.06 |
| 6,118,723 A * | 9/2000 | Agata et al. | 365/230.03 |
| 6,181,606 B1 * | 1/2001 | Choi et al. | 365/185.23 |
| 6,298,000 B1 * | 10/2001 | Kitade et al. | 365/222 |
| 6,414,838 B1 * | 7/2002 | Hidaka et al. | 365/189.11 |
| 2001/0028591 A1 * | 10/2001 | Yamauchi | 365/227 |
| 2001/0045579 A1 * | 11/2001 | Ooishi et al. | 257/222 |
| 2002/0031035 A1 * | 3/2002 | Tsuji et al. | 365/230.03 |

* cited by examiner

Primary Examiner—Viet Q. Nguyen
(74) Attorney, Agent, or Firm—Parkhurst & Wendel, L.L.P.

(57) ABSTRACT

To provide a semiconductor memory which can drive a word line faster than a conventional art, and reduce a layout area when a chip is formed as a semiconductor integrated circuit, thereby miniaturizing the chip. In the present invention, a word driver for driving the word line is constituted by a one-stage row decoder and a one-stage word driver group, and a load on a word line select signal is reduced, thereby driving the word line at high speeds.

8 Claims, 18 Drawing Sheets

SEMICONDUCTOR MEMORY

FIELD OF THE INVENTION

The present invention relates to a semiconductor memory having fast access to a built-in memory cell and particularly concerns a dynamic random access memory.

BACKGROUND OF THE INVENTION

Conventionally, in a semiconductor memory having fast access to a built-in memory cell, particularly in a dynamic random access memory (hereinafter, abbreviated as DRAM), a voltage VPP is usually used as a voltage of a word line. The voltage VPP is higher than a voltage for driving a bit line or a voltage for driving a control circuit.

Such a conventional semiconductor memory will be described.

FIG. 18 is a circuit diagram showing a conventional semiconductor memory. In FIG. 18, reference numeral 1 denotes a memory array, reference numeral 2 denotes a word driver, reference numeral 3 denotes a level shifter constituting the word driver 2, reference numeral 4 denotes a first-stage driver where a high voltage VPP is supplied, reference numeral 5 denotes second-stage drivers which receive a high voltage VPP and are driven by the first-stage driver 4, reference numeral 6 denotes word lines, reference numeral 7 denotes a memory cell, reference numeral 8 denotes a sense amplifier, reference numeral 9 denotes a sense amplifier driver, reference numeral A1 denotes a first address signal, and reference numeral A2 denotes a second address signal.

The level shifter 3 level-converts the first address signal Al, the output is inputted to the first-stage driver 4, and word-line select signals WD and /WD, which are the outputs of the first-stage driver 4, are inputted to the second-stage drivers 5. The second-stage drivers 5 are driven by the second address signal A2 and the outputs are connected to the word lines 6. Further, the word line 6 is connected to the memory cell 7. The memory cell 7 is connected to the sense amplifier 8 via a bit line, and the sense amplifier 8 is connected to the sense amplifier driver 9.

In response to the output of the level shifter 3 driven by the first address signal Al, the first-stage driver 4 outputs the word line select signals WD and /WD, and the second-stage drivers 5 receiving the word-line select signals WD and /WD drives the word lines 6.

Such a conventional semiconductor memory is configured such that the word lines 6 are driven by a two-stage configuration including the first-stage driver 4 and the second-stage drivers 5. Moreover, a number of two-stage drivers 5 are connected to the word line select signals WD and /WD outputted from the first-stage driver 4, and P-channel transistors 10 and 11 connected to the word-line select signal WD are large in size. Consequently, the load of the first-stage driver 4 is large and requires a long time to drive the word lines 6.

Additionally, between the word line 6 and a power source VPP supplied to the word line 6, two stages of the P-channel transistor 12 and the P-channel transistor 11 are connected in series, and the impedance rises. Therefore, it takes a longer time to drive the word lines 6.

DISCLOSURE OF THE INVENTION

The present invention is achieved to solve the above conventional problem. The object of the present invention is to provide a semiconductor memory by which a word line can be driven faster than the conventional art and a layout area can be reduced so as to miniaturize a chip in case where the chip is formed as a semiconductor integrated circuit.

The semiconductor memory of the present invention, in which a memory array comprising a plurality of bit line pairs driven by a signal based on data, a plurality of word lines driven by a signal based on an address, and memory cells placed on the intersections thereof is supplied with a signal based on the data and address, the plurality of bit line pairs and the plurality of word lines are driven so that the data is written into the memory cells via the plurality of bit line pairs, the semiconductor memory comprising: a plurality of level shifters for producing a first select signal, which. vary in voltage level between a first source voltage and a ground in response to a first address signal, and are activated at a ground level to select the word lines; a plurality of word drivers for driving a selected one of the word lines in response to the first select signal; each of said word drivers comprising: a first transistor of a first conductivity type inserted between an associated word line and a power line for supplying the first source voltage; and a second transistor of a second conductivity type inserted between the associated word line and the ground. The first select signal is inputted to a gate of the first transistor via a switch controlled by a second address signal different from the first address signal, and to a gate of the second transistor.

Further, the semiconductor memory of the present invention is configured that the level shifter further produces a second select signal which a polarity opposite to the first select signal, a voltage level of the second select signal varying between the first source voltage and the ground, wherein each of the word drivers further comprises: a third transistor of the first conductivity type having source connected to the source line, a drain connected to a gate of the first transistor, and a gate connected to said associated word line; a fourth transistor of the first conductivity type having a source connected to the source line, a drain connected to the gate of the first transistor, and a gate receiving the second select signal; and a fifth transistor of the second conductivity type having a source connected to the ground, a drain connected to the associated word line, and a gate receiving a third address signal with a polarity opposite to the second address signal. The switch comprises: a sixth transistor of the second conductivity type having a source receiving the first select signal, a gate receiving the second address signal, and a drain connected to the gate of the first transistor.

According to the above configurations, when driving the word line, it is possible to reduce impedance between the word line and the first power source, thereby driving the word line at high speeds.

Moreover, the semiconductor memory of the present invention is characterized in that the third transistor of the first conductivity type has a gate width one tenth of or less than that of the first transistor of the first conductivity type.

Additionally, the semiconductor memory of the present invention is characterized in that the fourth transistor of the first conductivity type has a gate width one tenth of or less than that of the first transistor of the first conductivity type.

According to the above configurations, it is possible to switch the word drivers at high speeds, thereby driving the word line at high speeds.

Also, the semiconductor memory of the present invention is characterized by arranging the plurality of word drivers such that the word lines selected and driven by the same level shifter from the plurality of level shifters are not adjacent to each other.

According to the above configuration, the sixth transistor of the second conductivity type can be formed to be of a small size, reducing a layout area of the word drivers.

Moreover, the semiconductor memory of the present invention is characterized by supplying the first power source exclusively from the outside of the chip.

According to the above configuration, it is possible to eliminate the need for mounting an exclusive booster circuit, thereby reducing a chip area.

Furthermore, the semiconductor memory of the present invention is characterized in that the first power source is supplied by boosting a second power source with a booster circuit provided in the chip, the second power source supplying a voltage lower than that of the first power source to another circuits such as a control circuit.

Additionally, the semiconductor memory of the present invention is characterized in that the first power source is the same as a power source supplied to an I/O pad.

According to the above configurations, the number of exclusive power sources can be reduced.

As described above, the word driver for driving the word line is comprised of a one-stage row decoder and one-stage word driver group, and a load decreases on the word line select signal. Hence, the word line can be driven at high speeds.

For this reason, it is possible to drive the word line faster than the conventional art, and reduce a layout area when a chip is formed as a semiconductor integrated circuit, thereby to miniaturize the chip.

DESCRIPTION OF THE EMBODIMENTS

Figure 1:
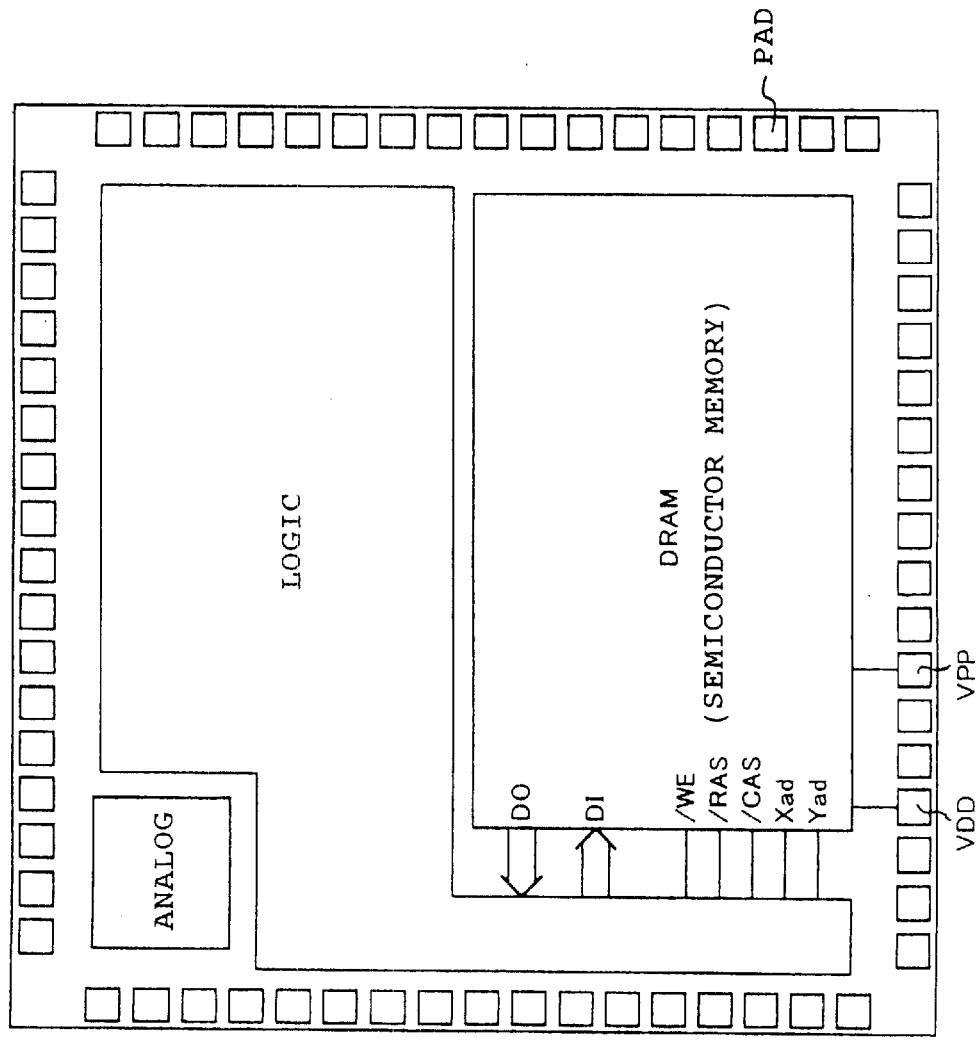
FIG. 1 is a diagram showing a chip of a semiconductor integrated circuit including a semiconductor memory according to Embodiment 1 of the present invention.

Referring to the drawings, the following will discuss embodiments of the present invention. As an example, a P-channel transistor is used as a first conductive transistor and an N-channel transistor is used as a second conductive transistor. Here, when a P-channel transistor is used as a first conductive transistor, an N-channel transistor is used as a second conductive transistor, and when an N-channel transistor is used as a first conductive transistor, a P-channel transistor is used as a second conductive transistor.

(Embodiment 1 )

A semiconductor memory will be discussed according to Embodiment 1 of the present invention.

FIG. 1 is a diagram showing a chip of a semiconductor integrated circuit including the semiconductor memory of Embodiment 1. Here, as shown in FIG. 1, a dynamic random access memory (hereinafter, abbreviated as DRAM) is illustrated as an example of the semiconductor memory. In the semiconductor integrated circuit, logic (logic circuit) and an analog circuit are further disposed on a single chip. Further, a plurality of pads are disposed on the chip and are electrically connected to the DRAM, logic (logic circuit), and the analog circuit.

The plurality of pads include pads for supplying VDD serving as a first power source of the DRAM and VPP serving as a second power source of the DRAM. Meanwhile, as the second power source VPP, a voltage higher than that of the first power source VDD is applied.

On the other hand, a data input DIn of the DRAM is connected to the logic, and a data output DOn of the DRAM is connected to the logic.

Moreover, a row address strobe signal /RAS serving as a control signal of the DRAM, a column address strobe signal /CAS, a write enable signal /WE (/ indicates negative polarity), a row address signal Xad serving as an address signal of the DRAM, and a column address signal Yad are connected to the logic.

Figure 2:
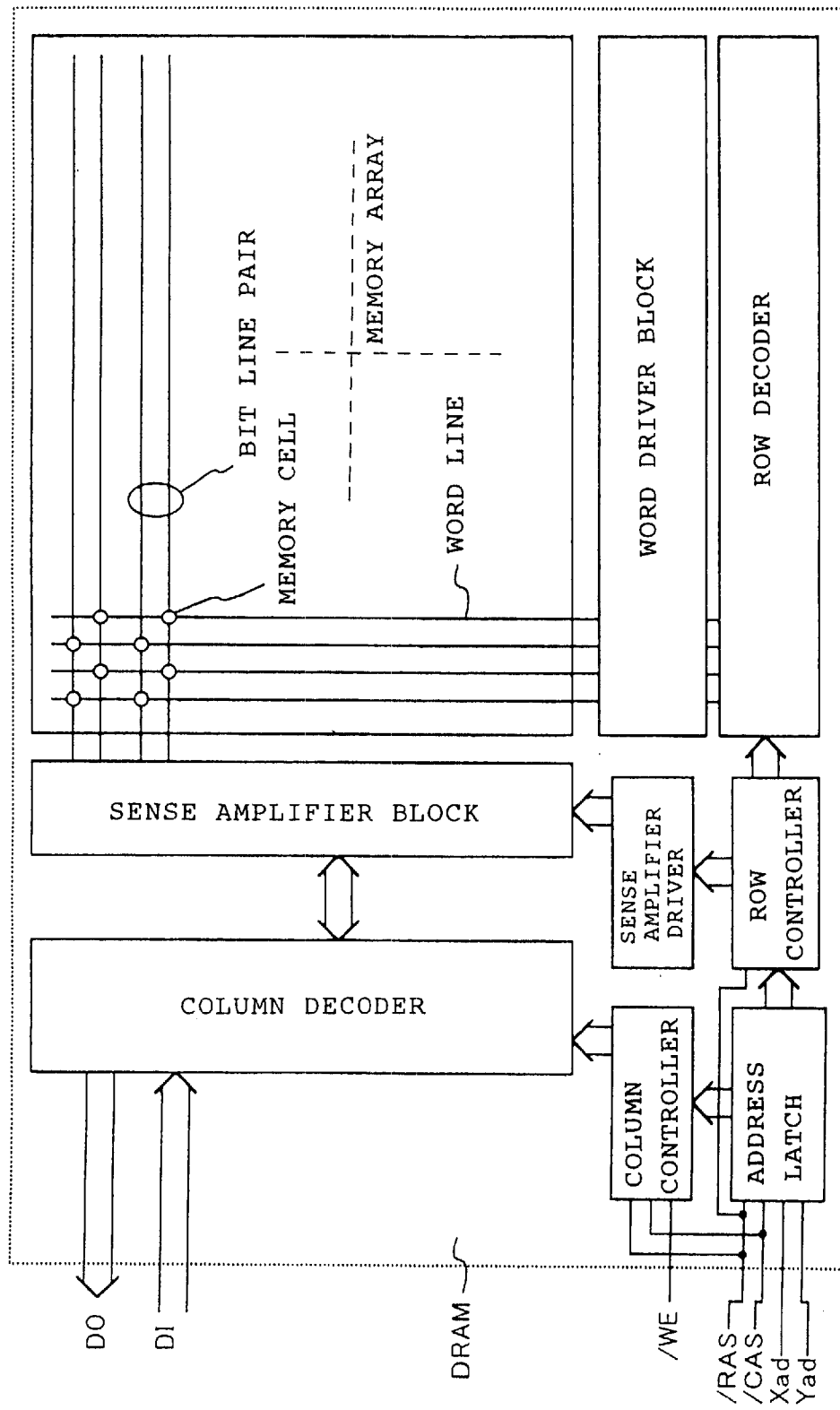
FIG. 2 is a block diagram showing a DRAM which is the semiconductor memory of Embodiment 1.

FIG. 2 is a block diagram showing the DRAM, which is the semiconductor memory of Embodiment 1. In FIG. 2, the DRAM is composed of a memory array, a word driver block, a row decoder, a sense amplifier block, a column decoder, a sense amplifier driver, a row controller, a column controller, and an address latch.

The memory array is composed of a plurality of bit line pairs, a plurality of word lines, and memory cells disposed on the intersections of the lines. The plurality of word lines are connected to the word driver block. Also, the plurality of bit lines are connected to the sense amplifier block.

The word driver block is connected to the row decoder and the row decoder is connected to the row controller. Additionally, the row controller is connected to the sense amplifier driver and the row address strobe signal /RAS. Furthermore, the sense amplifier driver is connected to the sense amplifier block.

The sense amplifier block is connected to the column decoder, and the data input DIn and the data output DOn are connected to the column decoder. Moreover, the column controller is connected to the column decoder, and the row address strobe signal /RAS, the column address strobe signal /CAS, and the write enable signal /WE are connected to the column controller.

Further, the address latch is connected to the row controller and the column controller. The row address strobe signal /RAS, the column address strobe signal /CAS, the row address signal Xad, and the column address signal Yad are connected to the address latch.

Figure 3:
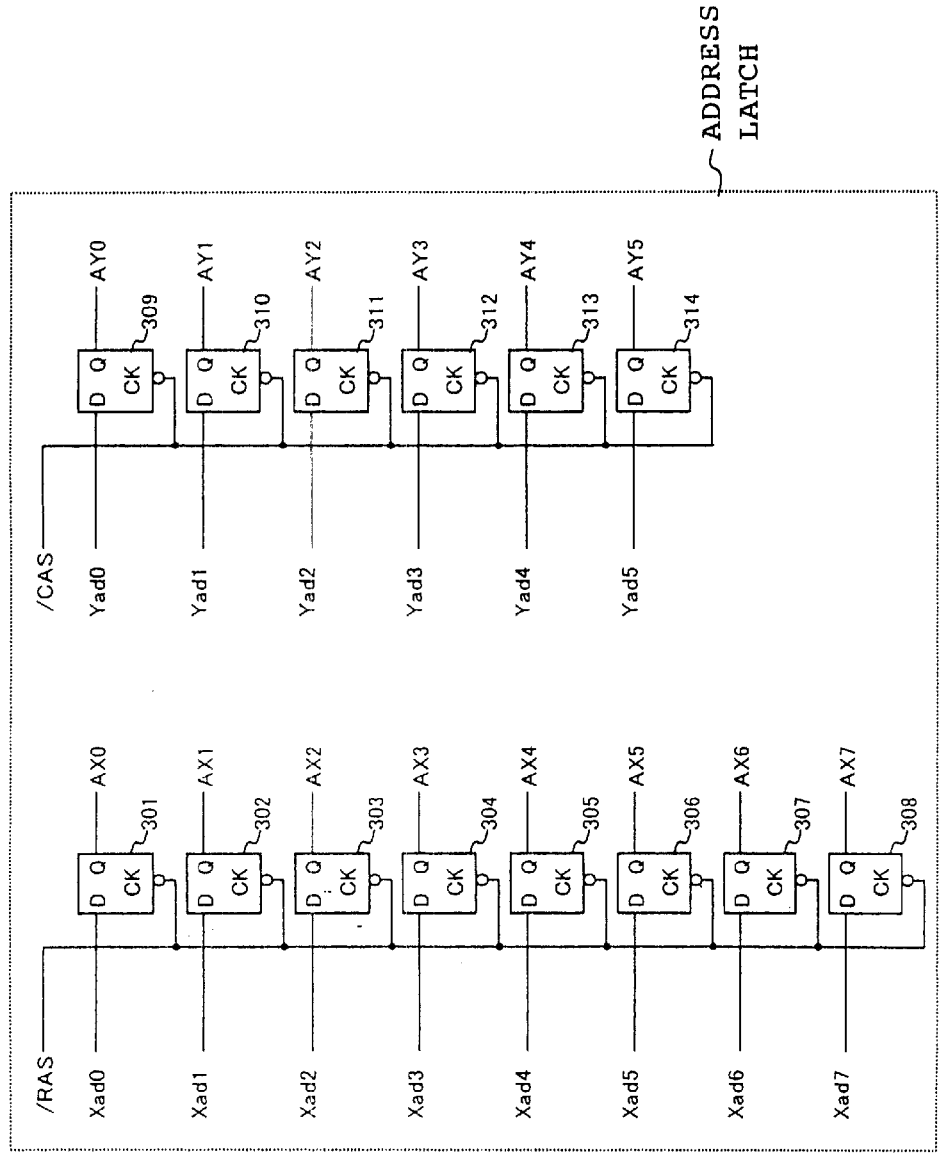
FIG. 3 is a circuit diagram showing an address latch of Embodiment 1.

FIG. 3 is a circuit diagram showing the address latch of Embodiment 1. In FIG. 3, the inputted row address signal Xadn consists of 8 bits in the present embodiment, and the bits Xad0 to Xad7 are respectively connected to the D terminals of D-flip flops 301 to 308. The output terminals Q of the D-flip flops 301 to 308 are respectively connected to row address latch signals AX0 to AX7. The CK terminals of the D-flip flops 301 to 308 are connected to the row address strobe signal /RAS.

Moreover, in the present embodiment, the inputted column address signal Yadn consists of 6 bits, and the bits Yad0 to Yad5 are respectively connected to the D terminals of D-flip flops 309 to 314. The output terminals Q of the D-flip flops 309 to 314 are respectively connected to column address latch signals AY0 to AY7. The CK terminals of the D-flip flops 309 to 314 are connected to the column address strobe signal /CAS.

Figure 4:
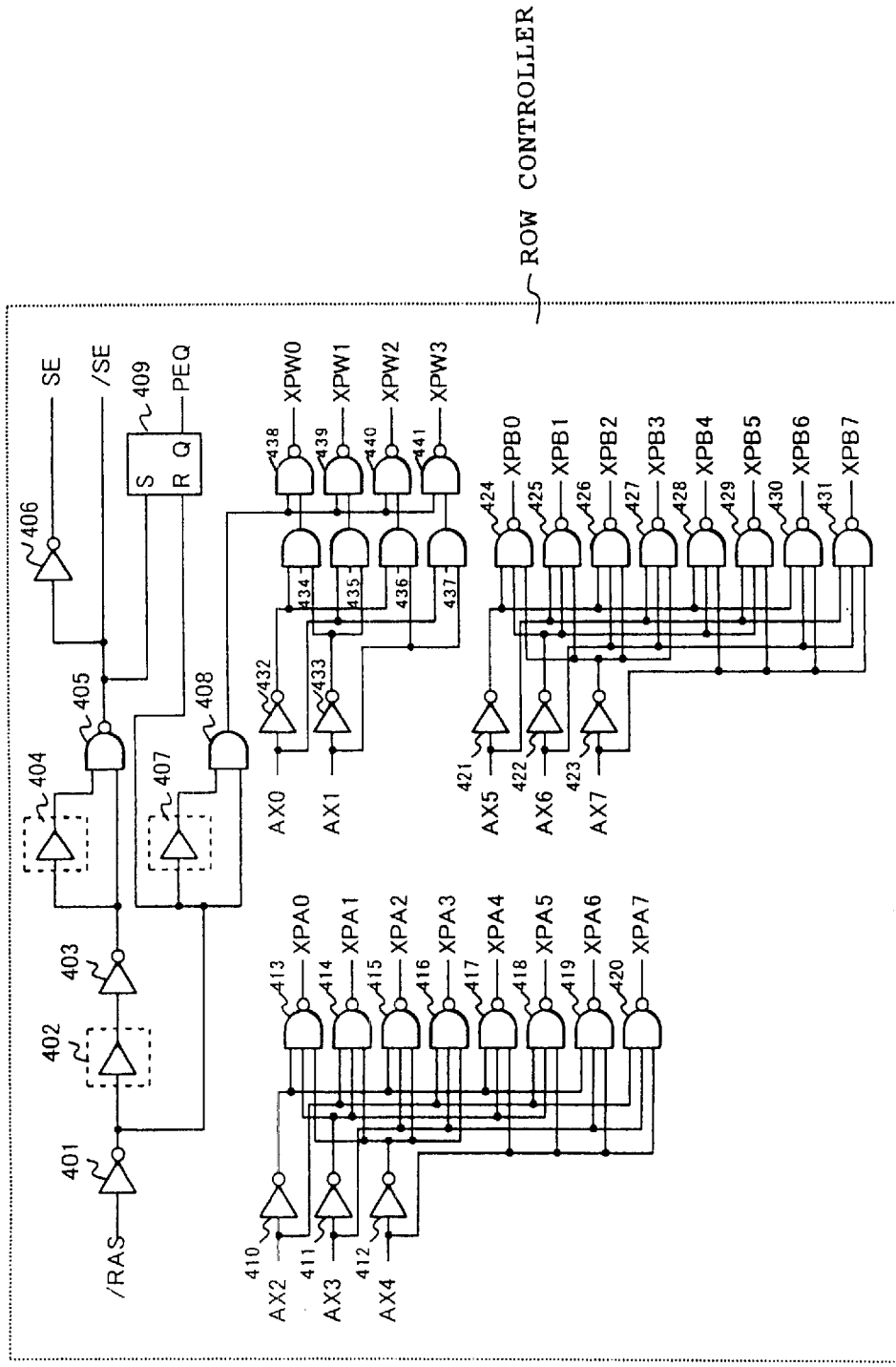
FIG. 4 is a circuit diagram showing a row controller of Embodiment 1.

FIG. 4 is a circuit diagram showing the row controller of Embodiment 1. In FIG. 4, the row controller is composed of a first inverter 401, a second inverter 403, a third inverter 406, fourth to sixth inverters 410 to 412, seventh to ninth inverters 421 to 423, tenth to eleventh inverters 432 to 433, a first delay element 402, a second delay element 404, a third delay element 407, a first NAND element 405, second to ninth NAND elements 413 to 420, tenth to seventeenth NAND elements 424 to 431, eighteenth to twenty-first NAND elements 438 to 441, a first AND element 408, second to fifth AND elements 434 to 437, and a first SR flip flop 409.

The row address strobe signal /RAS inputted to the row controller is inputted to the first inverter 401, and the output of the first inverter 401 is inputted to the first delay element 402, the third delay element 407, the first AND element 408, and the R (reset) terminal of the first SR flip flop 409.

The output of the first delay element 402 is inputted to the second inverter 403. The output of the second inverter 403 is inputted to the second delay element 404 and the first NAND element 405. The output of the second delay element 404 is inputted to the first NAND element 405. The output of the first NAND element 405 is a Pch sense amplifier startup signal /SE and is inputted to the third inverter 406 and the S (set) terminal of the first SR flip flop 409.

The output of the third inverter 406 is an Nch sense amplifier startup signal /SE. The output Q of the first SR flip flop 409 is a primary bit line equalize signal PEQ. The output of the third delay element 407 is inputted to the first AND element 408. The AX2 to AX4 of the row address latch signals are respectively inputted to the inputs of the fourth to sixth inverters 410 to 412.

The outputs of the fourth to sixth inverters 410 to 412 are inputted to the second NAND element 413, and the output of the second NAND element 413 is a row predecode signal XPA0. The outputs of the row address latch signal AX2 and the fifth and sixth inverters 411 and 412 are inputted to the third NAND element 414, and the output of the third NAND element 414 is a row predecode signal XPA1.

The outputs of the row address latch signal AX3 and the fourth and sixth inverters 410 and 412 are inputted to the fourth NAND element 415, and the output of the fourth NAND element 415 is a row predecode signal XPA2. The outputs of the row address latch signals AX2 and AX3 and the sixth inverter 412 are inputted to the fifth NAND element 416, and the output of the fifth NAND element 416 is a row predecode signal XPA3.

The outputs of the row address latch signal AX4 and the fourth and fifth inverters 410 and 411 are inputted to the sixth NAND element 417, and the output of the sixth NAND element 417 is a row predecode signal XPA4. The outputs of the row address latch signals AX2 and AX4 and the fifth inverter 411 are inputted to the seventh NAND element 418, and the output of the seventh NAND element 418 is a row predecode signal XPA5.

The outputs of the row address latch signals AX3 and AX4 and the fourth inverter 410 are inputted to the eighth NAND element 419, and the output of the eighth NAND element 419 is a row predecode signal XPA6. The row address latch signals AX2 to AX4 are inputted to the ninth NAND element 420, and the output of the ninth NAND element 420 is a row predecode signal XPA7.

The AX5 to AX7 of the row address latch signals are inputted to the inputs of the seventh to ninth inverters 421 to 423. The outputs of the seventh to ninth inverters 421 to 423 are inputted to the tenth NAND element 424, and the output of the tenth NAND element 424 is a row predecode signal XPB0.

The outputs of the row address latch signal AX5 and the eighth and ninth inverters 422 and 423 are inputted to the eleventh NAND element 425, and the output of the eleventh NAND element 425 is a row predecode signal XPB1. The outputs of the row address latch signal AX6 and the seventh and ninth inverters 421 and 423 are inputted to the twelfth NAND element 426, and the output of the twelfth NAND element 426 is a row predecode signal XPB2.

The outputs of the row address latch signals AX5 and AX6 and the ninth inverter 423 are inputted to the thirteenth NAND element 427, and the output of the thirteenth NAND element 427 is a row predecode signal XPB3. The outputs of the row address latch signal AX7 and the seventh and eighth inverters 421 and 422 are inputted to the fourteenth NAND element 428, and the output of the fourteenth NAND element 428 is a row predecode signal XPB4.

The outputs of the row address latch signals AX5 and AX7 and the eighth inverter 422 are inputted to the fifteenth NAND element 429, and the output of the fifteenth NAND element 429 is a row predecode signal XPB5. The outputs of the row address latch signals AX6 and AX7 and the seventh inverter 421 are inputted to the sixteenth NAND element 430, and the output of the sixteenth NAND element 430 is a row predecode signal XPB6. The row address latch signals AX5 and AX6 are inputted to the seventeenth NAND element 431, and the output of the seventeenth NAND element 431 is a row predecode signal XPB7.

The AX0 and AX1 of the row address latch signals are inputted to the inputs of the tenth and eleventh inverters 432 and 433. The outputs of the tenth and eleventh inverters 432 and 433 are inputted to the second AND element 434, and the output of the second AND element 434 is inputted to the eighteenth NAND element 438.

The outputs of the row address latch signal AX0 and the eleventh inverter 433 are inputted to the third AND element 435, and the output of the third AND element 435 is inputted to the nineteenth NAND element 439. The outputs of the row address latch signal AX1 and the tenth inverter 432 are inputted to the fourth AND element 436, and the output of the fourth AND element 436 is inputted to the twentieth NAND element 440.

The row address latch signals AX0 and AX1 are inputted to the fifth AND element 437, and the output of the fifth AND element 437 is inputted to the twenty-first NAND element 441. The output of the first AND element 408 is inputted to the eighteenth to twenty-first NAND elements 438 to 441, and the outputs of the eighteenth to twenty-first NAND elements 438 to 441 are word line predecode signals XPW0 to XPW3.

Figure 5:
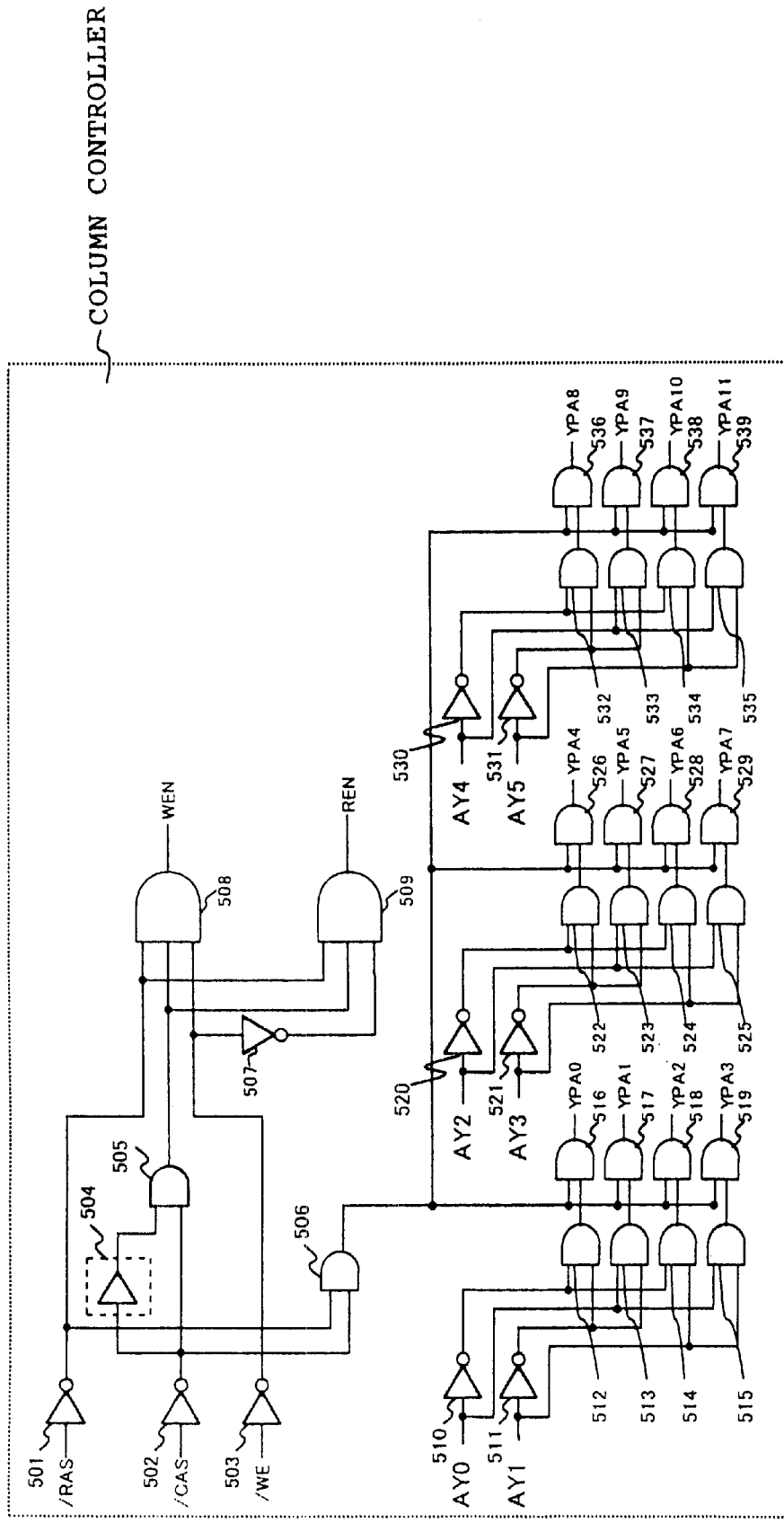
FIG. 5 is a circuit diagram showing a column controller of Embodiment 1.

FIG. 5 is a circuit diagram showing the column controller of Embodiment 1. In FIG. 5, the column controller is composed of twelfth to fourteenth inverters 501 to 503, a fifteenth inverter 507, sixteenth and seventeenth inverters 510 and 511, eighteenth and nineteenth inverters 520 and 521, twelfth and twenty-first inverters 530 and 531, a fourth delay element 504, sixth and seventh AND elements 505 and 506, eighth and ninth AND elements 508 and 509, tenth to seventeenth AND elements 512 to 519, eighteenth to twenty-fifth AND elements 522 to 529, and twenty-sixth to thirty-third AND elements 532 to 539.

The row address strobe signal /RAS inputted to the column controller is inputted to the twelfth inverter 501. The output of the twelfth inverter 501 is inputted to the seventh AND element 506 and the eighth and ninth AND elements 508 and 509.

Further, the column address strobe signal /CAS inputted to the column controller is inputted to the thirteenth inverter 502. The output of the thirteenth inverter 502 is inputted to the fourth delay element 504 and the sixth and seventh AND elements 505 and 506.

Moreover, the write enable signal /WE inputted to the column controller is inputted to the fourteenth inverter 503. The output of the fourteenth inverter 503 is inputted to the eighth AND element 508 and the fifteenth inverter 507.

The output of the sixth AND element 505 is inputted to the eighth AND element 508, and the output of the fifteenth inverter 507 is inputted to the ninth AND element 509. The output of the eighth AND element 508 is a light amplifier activation signal WEN, and the output of the ninth AND element 509 is a lead amplifier activation signal REN.

Also, the column address latch signal AY0 is inputted to the sixteenth inverter 510, and the column address latch signal AY1 is inputted to the seventeenth inverter 511.

The outputs of the sixteenth and seventeenth inverters 510 and 511 are inputted to the tenth AND element 512. The output of the seventeenth inverter 511 and the column address latch signal AY0 are inputted to the eleventh AND element 513. The output of the sixteenth inverter 510 and the column address latch signal AY1 are inputted to the twelfth AND element 514. The column address latch signals AY0 and AY1 are inputted to the thirteenth AND element 515.

Additionally, the outputs of the tenth to thirteenth AND elements 512 to 515 are respectively inputted to the fourteenth to seventeenth AND elements 516 to 519, and the output of the seventh AND element 506 is inputted to the fourteenth to seventeenth AND elements 516 to 519. The outputs of the fourteenth to seventeenth AND elements 516 to 519 are column predecode signals YPA0 to YPA3.

Furthermore, the column address latch signal AY2 is inputted to the eighteenth inverter 520, and the column address latch signal AY3 is inputted to the nineteenth inverter 521.

The outputs of the eighteenth and nineteenth inverters 520 and 521 are inputted to the eighteenth AND element 522. The output of the nineteenth inverter 521 and the column address latch signal AY2 are inputted to the nineteenth AND element 523. The output of the eighteenth inverter 520 and the column address latch signal AY3 are inputted to the twentieth AND element 524. The column address latch signals AY2 and AY3 are inputted to the twenty-first AND element 525.

Further, the outputs of the eighteenth to twenty-first AND elements 522 to 525 are respectively inputted to the twenty-second to twenty-fifth AND elements 526 to 529. The output of the seventh AND element 506 is inputted to the twenty-second to twenty-fifth AND elements 526 to 529. The outputs of the twenty-second to twenty-fifth AND elements 526 to 529 are column predecode signals YPA4 to YPA7.

Moreover, the column address latch signal AY4 is inputted to the twentieth inverter 530, and the column address latch signal AY5 is inputted to the twenty-first inverter 531.

The outputs of the twentieth and twenty-first inverters 530 and 531 are inputted to the twenty-sixth AND element 532. The output of the twenty-first inverter 531 and the column address latch signal AY4 are inputted to the twenty-seventh AND element 533. The output of the twentieth inverter 530 and the column address latch signal AY5 are inputted to the twenty-eighth AND element 534. The column address latch signals AY4 and AY5 are inputted to the twenty-ninth AND element 535.

Additionally, the outputs of the twenty-sixth to twenty-ninth AND elements 532 to 535 are respectively inputted to the thirtieth to thirty-third AND elements 536 to 539, and the output of the seventh AND element 506 is inputted to the thirtieth to thirty-third AND elements 536 to 539. The outputs of the thirtieth to thirty-third AND elements 536 to 539 are column predecode signals YPA8 to YPA11.

Figure 6:
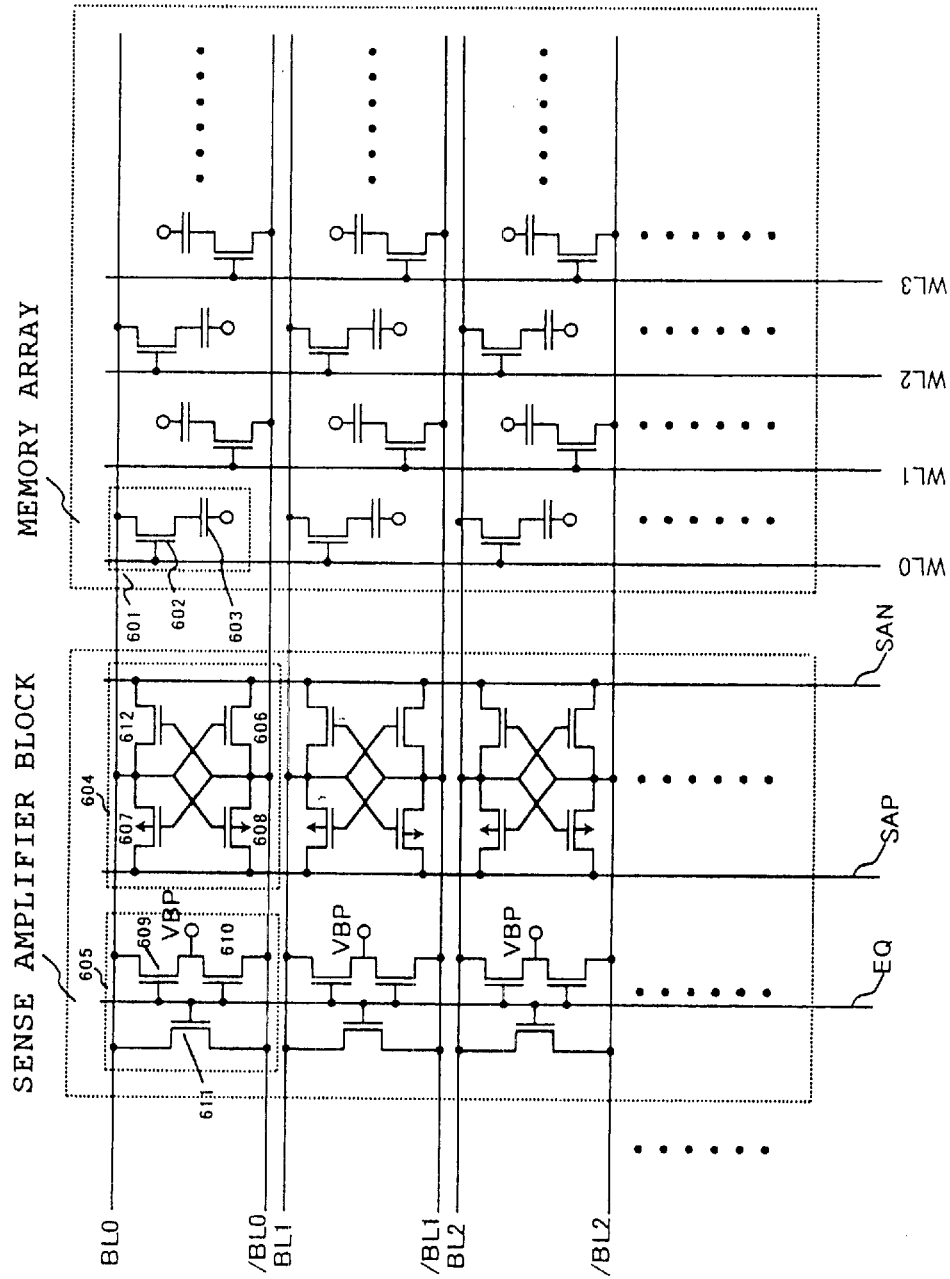
FIG. 6 is a circuit diagram showing a memory array and a sense amplifier block of Embodiment 1.

FIG. 6 is a circuit diagram showing the memory array and the sense amplifier block of Embodiment 1. In FIG. 6, the memory array is composed of a plurality of word lines WLn (n=0 to 255 in the present embodiment) and memory cells 601, which are disposed on the intersections of a plurality of intersecting bit line pairs of BLn and /BLn (n=0 to 1024 in the present embodiment).

The memory cell 601 is composed of a memory cell transistor 602 serving as an N-channel transistor and a capacitor 603. The word line WLn is connected to the gate of the memory cell transistor 602, the bit line BLn is connected to the source of the memory cell transistor 602, and the capacitor 603 is connected to the drain of the memory cell transistor 602. A half voltage of the first power source VDD of the DRAM is supplied to the other node of the capacitor 603.

The sense amplifier block is composed of a plurality of sense amplifiers 604 and a plurality of precharge circuits 605. The bit line pair of BLn and /BLn is connected to the sense amplifier 604. The sense amplifier 604 is a CMOS coupling sense amplifier circuit composed of N-channel transistors 612 and 606 and P-channel transistors 607 and 608.

The bit line BLn is connected to the source of the N-channel transistor 612, the bit line /BLn is connected to the gate of the transistor 612, and a sense amplifier ground SAN is connected to the drain of the transistor 612. The bit line /BLn is connected to the source of the N-channel transistor 606, the bit line BLn is connected to the gate of the transistor 606, and the sense amplifier ground SAN is connected to the drain of the transistor 606.

The bit line BLn is connected to the source of the P-channel transistor 607, the bit line /BLn is connected to the gate of the transistor 607, and a sense amplifier source SAP is connected to the drain of the transistor 607. The bit line /BLn is connected to the source of the P-channel transistor 608, the bit line BLn is connected to the gate of the transistor 608, and the sense amplifier source SAP is connected to the drain of the transistor 608.

The precharge circuit 605 is composed of N-channel transistors 609 to 611. The source of the N-channel transistor 609 is connected to the bit line BLn, the drain thereof is connected to a bit line precharge power source VBP, and the gate thereof is connected to a bit line precharge signal EQ. The source of the N-channel transistor 610 is connected to the bit line /BLn, the drain thereof is connected to the bit line precharge power source VBP, and the gate thereof is connected to the bit line precharge signal EQ. Further, the power source of the N-channel transistor 611 is connected to the bit line BLn, the drain thereof is connected to the bit line /BLn, and the gate thereof is connected to the bit line precharge signal EQ.

As a high-level voltage of the bit line precharge signal EQ, a voltage equal to the second power source VPP of the DRAM is supplied. Thus, the gate oxide films of the N-channel transistors 609 to 611 are sufficiently large in thickness to be resistant against the voltage.

Figure 7:
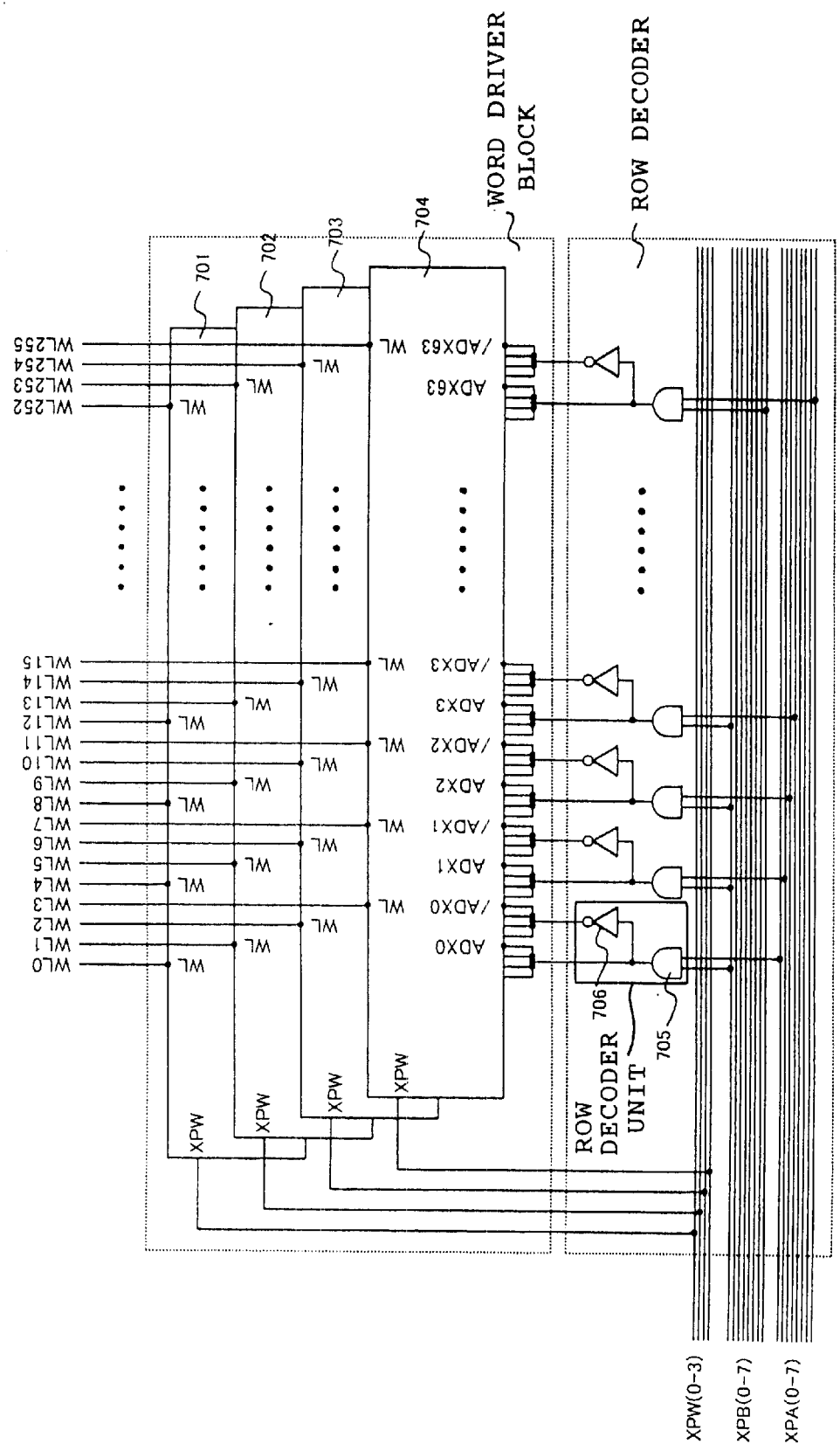
FIG. 7 is a circuit diagram showing a word driver block and a row decoder of Embodiment 1.

FIG. 7 is a circuit diagram showing the word driver block and the row decoder of Embodiment 1. In FIG. 7, the word driver block is composed of first to fourth word driver units 701 to 704. The word line predecode signals XPW0 to XPW3 are respectively connected to the first to fourth word driver units 701 to 704.

A plurality of word lines WL4n (n=0 to 63) is connected to the first word driver unit 701. Moreover, a plurality of word lines WL4n+1 (n=0 to 63) are connected to the second word driver unit 702. A plurality of word lines WL4n+2 (n=0 to 63) are connected to the third word driver unit 703. A plurality of word lines WL4n+3 (n=0 to 63) are connected to the fourth word driver unit 704.

In the row decoder, 64 row decoder units are disposed, each composed of an AND element 705 and an inverter 706 connected to the output of the AND element 705. To the input of the AND element 705 in the row decoder unit, two row predecode signals are connected in total including one of the seven row predecode signals XPA0 to XPA7 and one of the seven row predecode signals XPB0 to XPB7.

The output of the AND element 705 of the row decoder unit connected to the row predecode signals XPA0 and XPB0 is a row decode signal ADX0, and the output of the inverter 706 is a row decode signal /ADX0. In the same manner, the output of the row decoder unit connected to the row predecode signals XPA1 and XPB0 is row decode signals ADX1 and /ADX1.

As described above, the row decode signals are outputted to ADXn (n=0 to 63) while XPA (0 to 7) is set at a low level. The row decode signals ADXn (n=0 to 63) are respectively inputted to the first to fourth word driver units 701 to 704.

Figure 8:
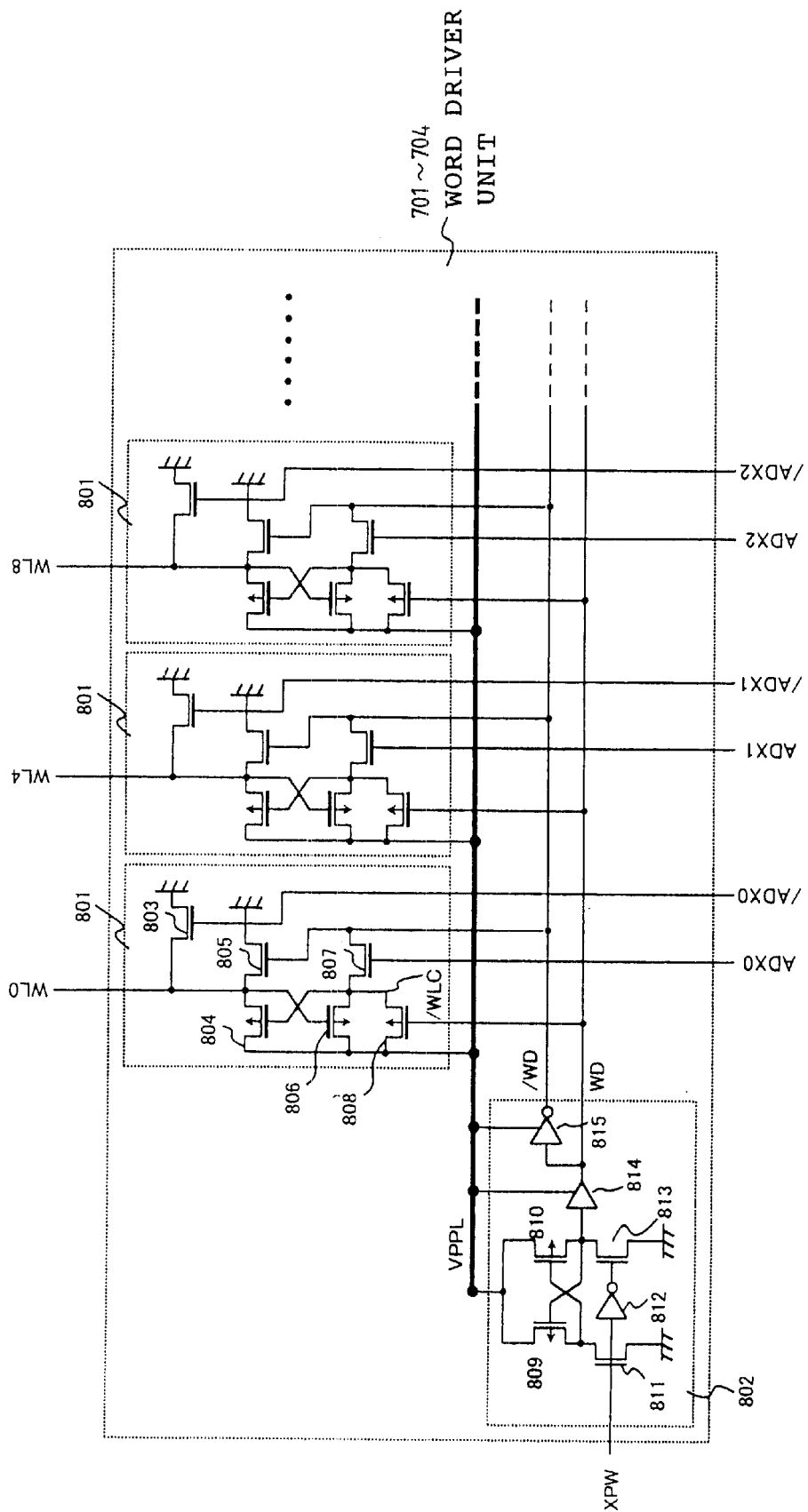
FIG. 8 is a circuit diagram showing the word driver unit of Embodiment 1.

FIG. 8 is a circuit diagram showing the word driver unit of Embodiment 1. In FIG. 8, reference numeral 801 denotes word drivers, reference numeral 802 denotes a level shifter, reference character VPPL denotes a metal wire, reference numeral 803 denotes N-channel transistors, reference numeral 804 denotes P-channel transistors, reference numeral 805 denotes N-channel transistors, reference numeral 806 denotes P-channel transistors, reference numeral 807 denotes N-channel transistors, reference numeral 808 denotes P-channel transistors, reference character /WLC denotes nodes, reference characters WD and /WD denote word line select signals, reference numeral 809 denotes a P-channel transistor, reference numeral 810 denotes a P-channel transistor, reference numeral 811 denotes an N-channel transistor, reference numeral 813 denotes an N-channel transistor, reference numeral 812 denotes an inverter, reference numeral 815 denotes an inverter, and reference numeral 814 denotes a buffer.

The word driver units 701 to 704 are each composed of the 64 word drivers 801, the single level shifter 802, and the thick metal wire VPPL where the second power source VPP is supplied with sufficiently small impedance.

The word driver 801 is composed of the N-channel transistor 803, the N-channel transistor 805, the N-channel transistor 807, the P-channel transistor 804, the P-channel transistor 806, and the P-channel transistor 808.

The source of the P-channel transistor 804 is connected to the metal wire VPPL, the gate thereof is connected to the node /WLC, the drain thereof is connected to a predetermined word line WLn, and the board node thereof is connected to the second power source VPP. Also, the source of the P-channel transistor 806 is connected to the metal wire VPPL, the gate thereof is connected to a predetermined word line WLn, the drain thereof is connected to the node /WLC, and the board node thereof is connected to the second power source VPP. Further, the source of the P-channel transistor 808 is connected to the metal wire VPPL, the gate thereof is connected to the word line select signal WD, the drain thereof is connected to the node /WLC, and the board node thereof is connected to the second power source VPP.

Moreover, the source of the N-channel transistor 803 is connected to a predetermined word line WLn, the gate thereof is connected to the row decode signal /ADXn, the drain thereof is connected the ground (ground potential), and the board node thereof is connected to the ground (ground potential). Additionally, the source of the N-channel transistor 805 is connected to a predetermined word line WLn, the gate thereof is connected to the word line select signal /WD, the drain thereof is connected to the ground (ground potential), and the board node thereof is connected to the ground (ground potential). Furthermore, the source of the N-channel transistor 807 is connected to the node /WLC, the gate thereof is connected to the row decode signal ADXn, the drain thereof is connected to the word line select signal /WD, and the board node thereof is connected to the ground (ground potential).

The 1024 memory cells are connected to the word line WLn, resulting in a long wiring and a large load. The P-channel transistor 804 is used with a large gate width (about 10 $\mu$m) to charge the word line WLn, which has a large load, to the second power source VPP in a predetermined period.

Further, the N-channel transistor 805 is used with a large gate width (about 5 $\mu$m) to charge the word line WLn, which has a large load, to the ground potential in a predetermined period. Moreover, the N-channel transistor 803 is used with a gate width large enough to keep the word line WLn at a ground potential and to suppress coupling noise in the operation of the adjacent word line.

The P-channel transistors 806 and 808 and the N-channel transistor 807 are used with a gate width small enough to charge the node /WLC in a predetermined period. Particularly the P-channel transistors 806 and 808 are used with a minimum gate width (0.5 $\mu$m at the maximum).

The level shifter 802 is composed of the P-channel transistors 809 and 810, the N-channel transistors 811 and 813, the inverters 812 and 815, and the buffer 814. The inputted word line predecode signal XPWn (n=0 to 3) is inputted to the gate of the N-channel transistor 811 and the inverter 812. The output of the inverter 812 is inputted to the gate of the N-channel transistor 813.

The source of the N-channel transistor 811 is connected to the drain of the P-channel transistor 809 and the gate of the P-channel transistor 810. Moreover, the drain of the N-channel transistor 811 is connected to the ground.

The source of the N-channel transistor 813 is connected to the drain of the P-channel transistor 810, the gate of the P-channel transistor 809, and the buffer 814. Additionally, the drain of the N-channel transistor 813 is connected to the ground.

The source of the P-channel transistors 809 and 810 is connected to the metal wire VPPL. The output of the buffer 814 is the word line select signal WD and is inputted to the inverter 815. The output of the inverter 815 is the word line select signal /WD. Additionally, the second power source VPP is supplied to the buffer 814 and the inverter 815 as a high-level power source.

Figure 9:
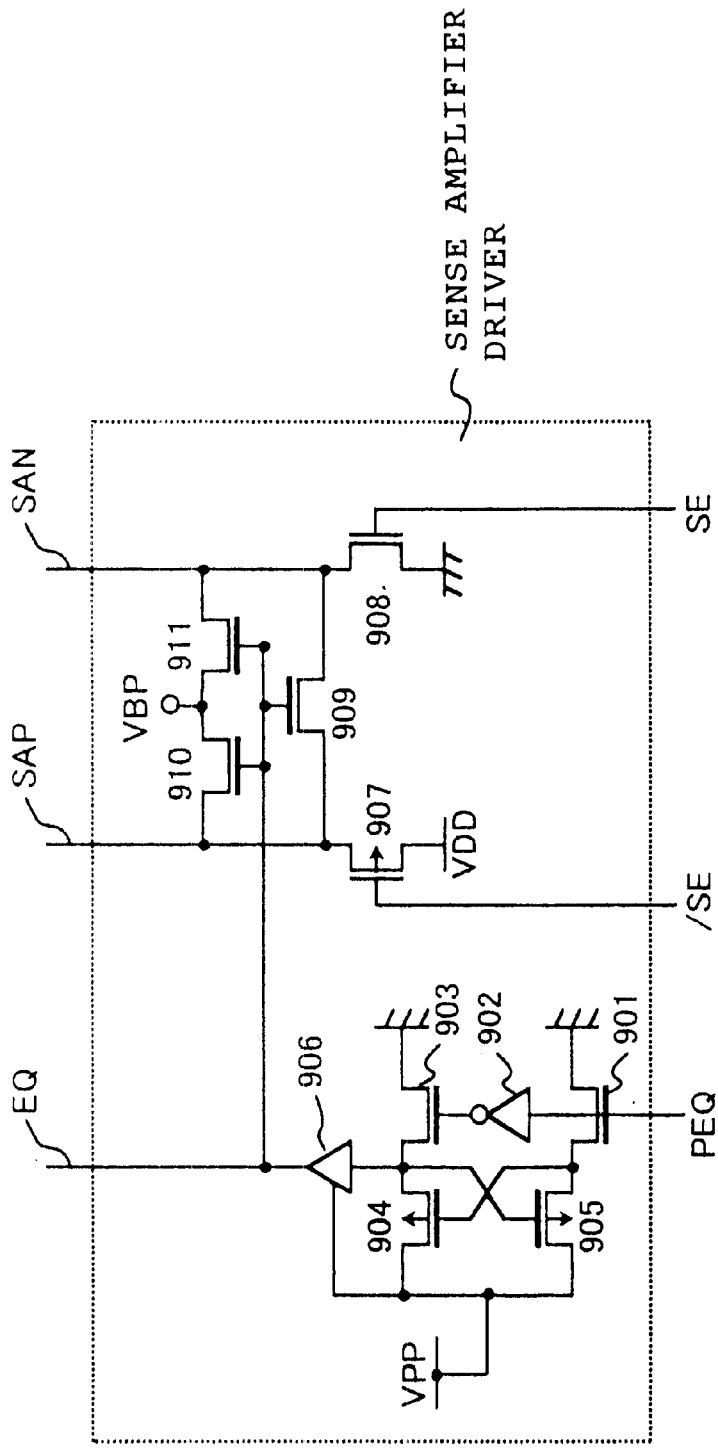
FIG. 9 is a circuit diagram showing a sense amplifier driver of Embodiment 1.

FIG. 9 is a circuit diagram showing the sense amplifier driver of Embodiment 1. In FIG. 9, the sense amplifier driver is composed of N-channel transistors 901 and 903, an inverter 902, P-channel transistors 904 and 905, a buffer 906, a P-channel transistor 907, and N-channel transistors 908 to 911. The N-channel transistors 901 and 903, the P-channel transistors 904 and 905, and the N-channel transistors 909 to 911 have gate oxide films which are large in thickness.

The primary bit line equalize signal PEQ, the Pch sense amplifier startup signal /SE, and the Nch sense amplifier startup signal SE are inputted to the sense amplifier driver. The primary bit line equalize signal PEQ is inputted to the gate of the N-channel transistor 901 and the inverter 902.

The drain of the N-channel transistor 901 is connected to the ground, the source of the N-channel transistor 901 is connected to the drain of the P-channel transistor 905 and the gate of the P-channel transistor 904. The output of the inverter 902 is inputted to the gate of the N-channel transistor 903.

The source of the N-channel transistor 903 is connected to the drain of the P-channel transistor 904, the gate of the P-channel transistor 905, and the buffer 906. The source of the P-channel transistor 904 and 905 is connected to the second power source VPP. The second source VPP is supplied to the buffer 906, and the output is the bit line precharge signal EQ.

The Pch sense amplifier startup signal /SE is connected to the gate of the P-channel transistor 907, the first power source VDD is connected to the source of the P-channel transistor 907, and the drain thereof is connected to the sense amplifier power source SAP. The Nch sense amplifier startup signal SE is connected to the gate of the N-channel transistor 908, the drain of the N-channel transistor 908 is connected to the ground, and the sense amplifier ground SAN is connected to the drain of the N-channel transistor 908.

The sense amplifier power source SAP is connected to the source of the N-channel transistor 909, the sense amplifier ground SAN is connected to the drain of the N-channel transistor 909, and the bit line precharge signal EQ is connected to the gate of the N-channel transistor 909. The sense amplifier power source SAP is connected to the source of the N-channel transistor 910, the bit line precharge source VBP is connected to the drain of the N-channel transistor 910, and the bit line precharge signal EQ is connected to the gate of the N-channel transistor 910. The sense amplifier ground SAN is connected to the source of the N-channel transistor 911, the bit line precharge power source VBP is connected to the drain of the N-channel transistor 911, and the bit line precharge signal EQ is connected to the gate of the N-channel transistor 911.

Figure 10:
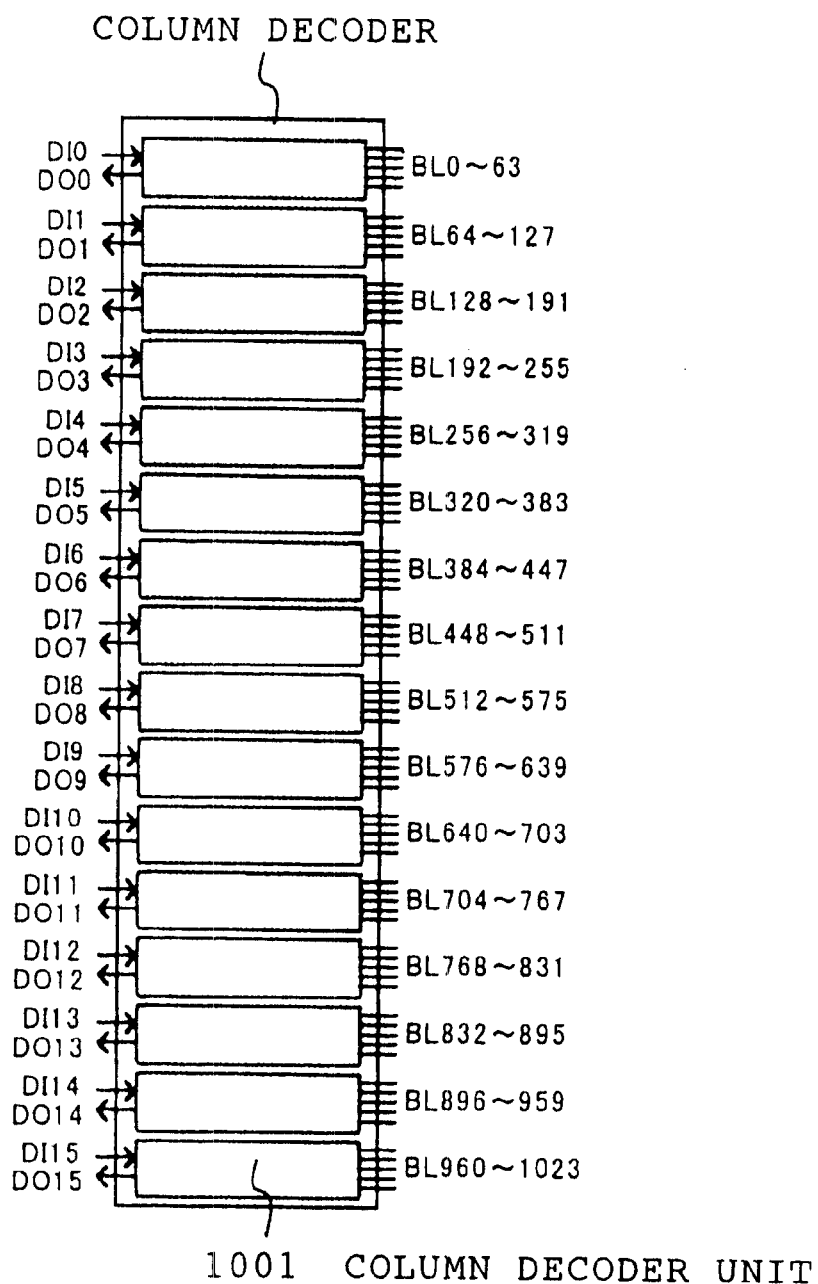
FIG. 10 is a block diagram showing a column decoder of Embodiment 1.

FIG. 10 is a block diagram showing the column decoder of Embodiment 1. In FIG. 10, the column decoder is composed of 16 column decoder units 1001. One of the data inputs DIn and one of the data outputs DOn are connected to each of the column decoder units 1001.

Bit line pairs of BL0 to BL63 and /BL0 to /BL63 are connected to the column decoder unit 1001, which is connected to the data input DI0 and the data output DO0. Further, bit line pairs of BL64 to BL127 and /BL64 to /BL127 are connected to the column decoder unit 1001, which is connected to the data input DI1 and the data output DO1.

In the same manner, all bit line pairs of BL0 to BL1023 and /BL0 to /BL1023 are connected to the data inputs DI0 to DI15 and the data outputs DO0 to DO15 via the column decoder units 1001.

Figure 11:
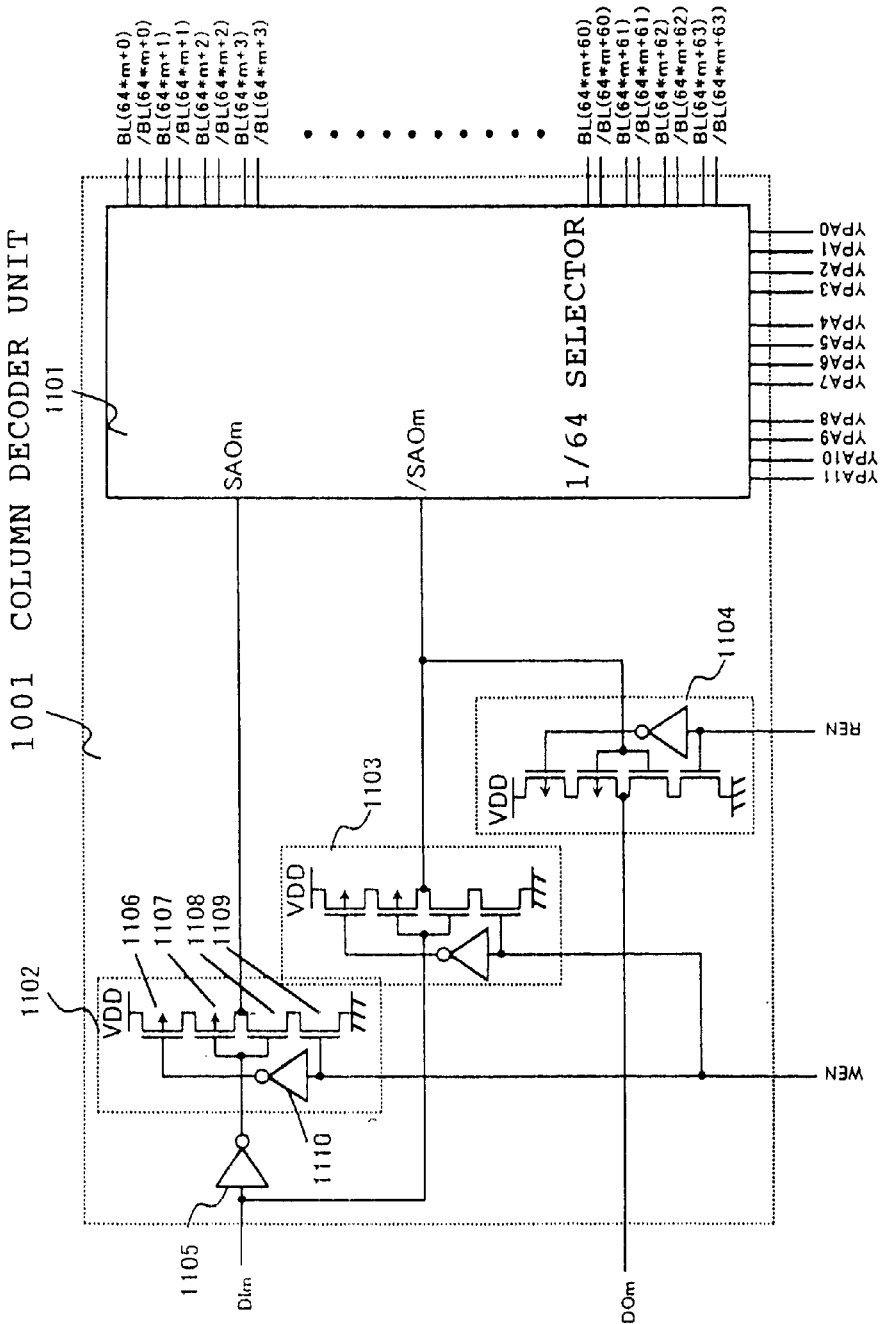
FIG. 11 is a circuit diagram showing a column decoder unit of Embodiment 1.

FIG. 11 is a circuit diagram showing the column decoder unit of Embodiment 1. Here, a typical circuit diagram with the number of m (m=0, 1, . . . , 15) is shown. In FIG. 11, reference numeral 1101 denotes a 1/64 selector, reference numerals 1102 to 1104 denote tristate buffers, reference numeral 1105 denotes a twenty-second inverter, reference characters SAOm and /SAOm denote data nodes, reference numerals 1106 and 1107 denote P-channel transistors, and reference numerals 1108 and 1109 denote N-channel transistors.

The tristate buffer 1102 is composed of the P-channel transistors 1106 and 1107, the N-channel transistors 1108 and 1109, and a twenty-third inverter 1110. The first power source VDD is connected to the source of the P-channel transistor 1106. The output of the twenty-third inverter 1110 is connected to the gate of the P-channel transistor 1106. The source of the P-channel transistor 1107 is connected to the drain of the P-channel transistor 1106. The input of the tristate buffer 1102 is inputted to the gate of the P-channel transistor 1107. The drain thereof is the output of the tristate buffer 1102.

The ground is connected to the drain of the N-channel transistor 1109. The control input of the tristate buffer 1102 is connected to the gate of the N-channel transistor 1109. The drain of the N-channel transistor 1108 is connected to the source of the N-channel transistor 1109. The input of the tristate buffer 1102 is connected to the gate of the N-channel transistor 1108. The drain of the N-channel transistor 1108 is the output of the tristate buffer 1102.

The input of the tristate buffer 1102 having the above configuration is connected to the output of the twenty-second inverter 1105. The output of the tristate buffer 1102 is connected to the data node SAO and the control input thereof is connected to the light amplifier activation signal WEN.

The data input DIm (m=0, 1, . . . , 15) is connected to the input of the twenty-second inverter 1105. The tristate buffer 1103 is configured as the tristate buffer 1102. The output of the tristate buffer 1103 is connected to the data node /SAOm (m=0, 1, . . . , 15), the input thereof is connected to the data input DIm (m=0, 1, . . . , 15), and the control input thereof is connected to the light amplifier activation signal WEN.

The tristate buffer 1104 is configured as the tristate buffer 1102. The output of the tristate buffer 1104 is connected to a data output DOm (m=0, 1, . . . , 15), the input thereof is connected to the data input data node /SAOm (m =0, 1, . . . , 15), and the control input thereof is connected to the lead amplifier activation signal REN.

Bit line pairs of BL64*m to BL (64*m+63) and /BL64*m to /BL (64*m+63)(m=0, 1, . . . , 15) and the data nodes SAOm and /SAOm are connected to the 1/64 selector 1101.

Figure 12:
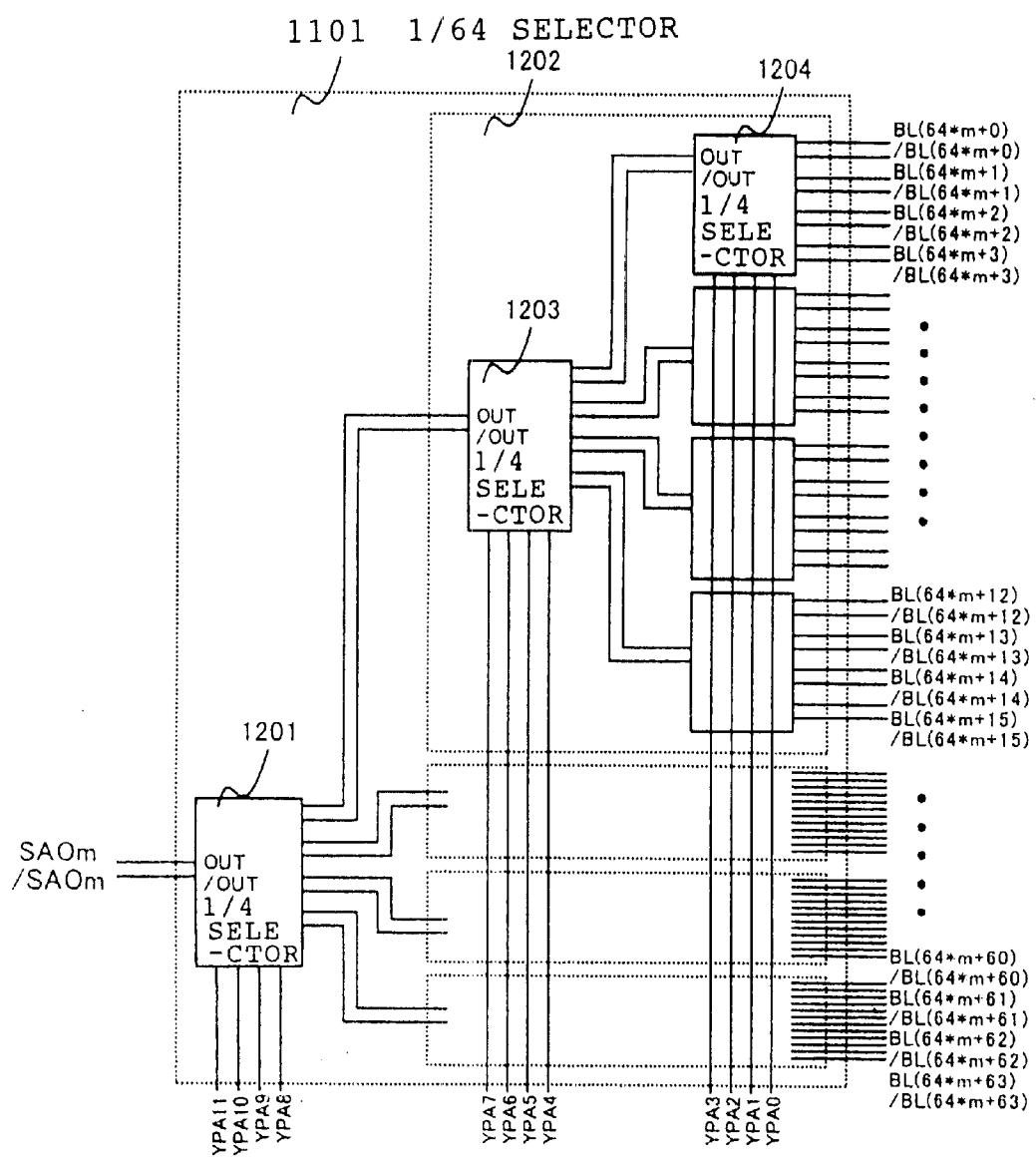
FIG. 12 is a circuit diagram showing a 1/64 selector of Embodiment 1.

FIG. 12 is a circuit diagram showing the 1/64 selector of Embodiment 1. Here, a typical circuit diagram with the number of m (m=0, 1, . . . , 15) is shown. In FIG. 12, the 1/64 selector 1101 is composed of a single 1/4 selector 1201 and four 1/16 selectors 1202. 16 pairs of bit lines BL (64*m) to BL (64*m+15) and /BL (64*m) to /BL(64*m+15)(m=0, 1, . . . , 15) are inputted to the 1/16 selector 1202. Moreover, the output of the 1/16 selector 1202 is inputted to the 1/4 selector 1201.

The outputs of the 1/4 selector 1201 are the data node SAOm and /SAOm(m=0, 1, . . . , 15). The column predecode signals YPA8 to YPA11 are inputted to the 1/4 selector 1201 as control signals.

Meanwhile, the 1/16 selector 1202 is composed of a single 1/4 selector 1203 and four 1/4 selectors 1204. Four pairs of bit lines BL (64*m+k) to BL (64*m+3+k) and /BL (64*m+k) to /BL (64*m+3+k) (k=0, 4, 8, 12) are inputted to each of the 1/4 selectors 1204.

A hierarchical structure is formed in which the outputs of the four 1/4 selectors 1204 are inputted to the 1/4 selector 1203. Also, the column predecode signals YPA0 to YPA3 are inputted to the 1/4 selector 1204 as control signals, and the column predecode signals YPA4 to YPA7 are inputted to the 1/4 selector 1203 as control signals.

Figure 13:
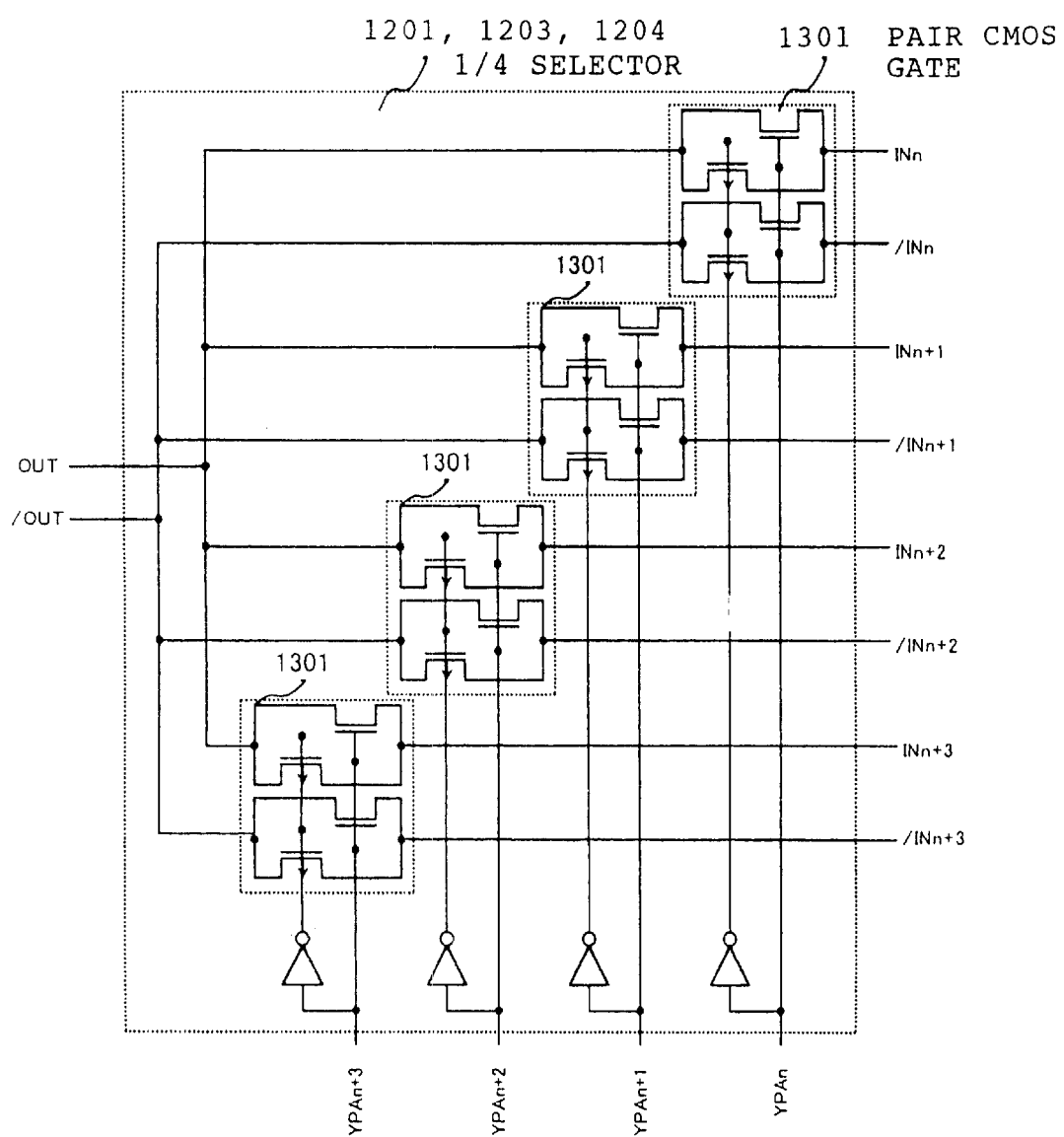
FIG. 13 is a 1/4 selector of Embodiment 1.

FIG. 13 is a circuit diagram showing the 1/4 selector of Embodiment 1. In FIG. 13, four pair CMOS gates 1301 are formed, each including two N-channel transistors and two P-channel transistors. Each of the pair CMOS gates 1301 has two terminal inputs and two terminal outputs.

Regarding the pair CMOS gates 1301, one of the terminals is connected in parallel to the two terminal outputs of the 1/4 selector 1201, and the other terminals are separately connected to the input terminals of the 1/4 selector 1201.

The column predecode signals YPAn to YPAn+3 for controlling the N-channel transistor are respectively connected to the pair CMOS gates 1301, and the column predecode signals YPAn to YPAn+3 for controlling the P-channel transistor are respectively connected to the pair CMOS gates 1301 via inverters.

Figure 14:
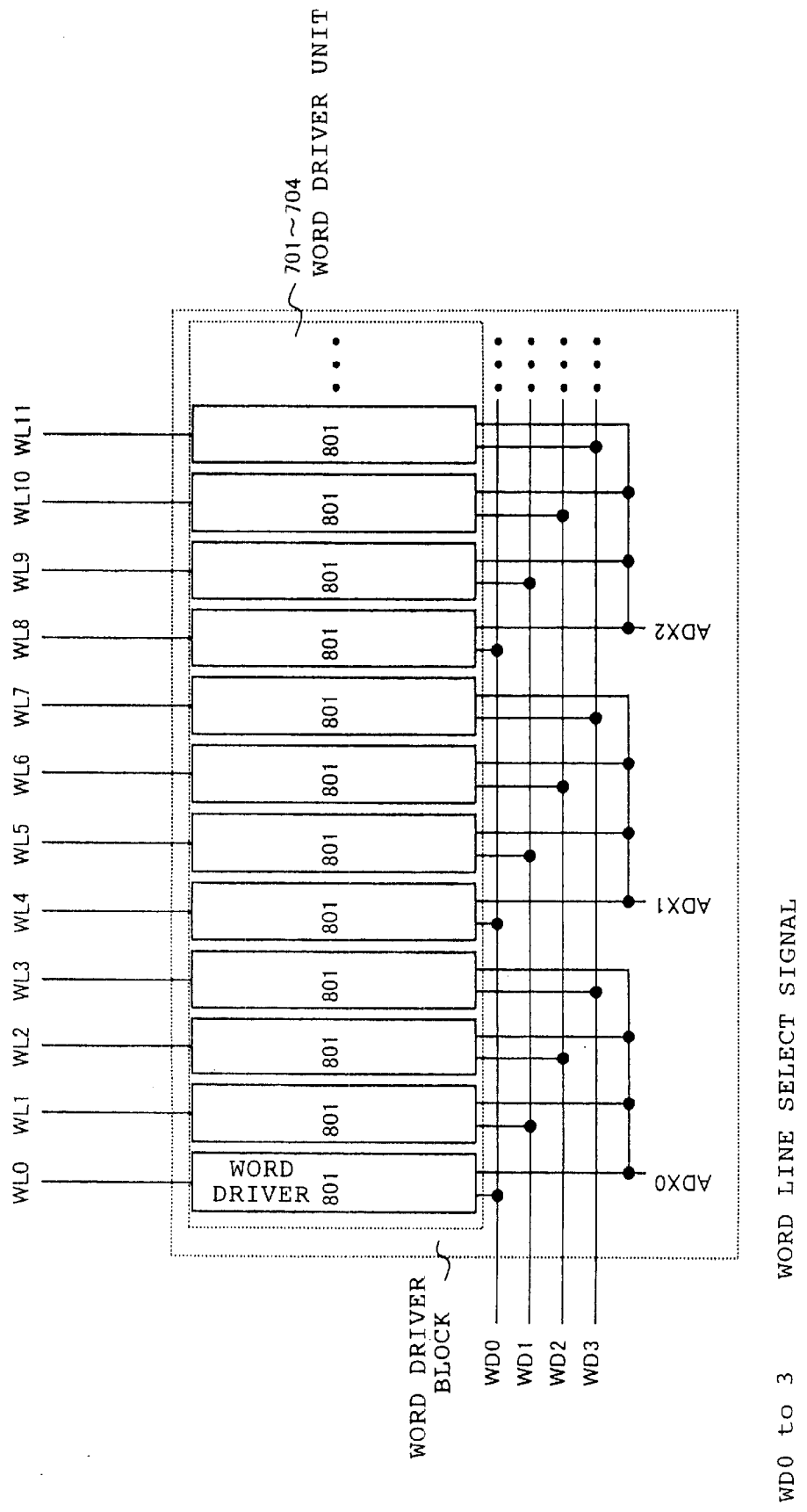
FIG. 14 is a layout showing a word driver of Embodiment 1.

FIG. 14 is a layout showing the word driver of Embodiment 1. In FIG. 14, the word driver unit 701 includes 64 word drivers 801 for driving word lines WLn (n=0, 4, 8, . . . , 60). In the same manner, the word driver units 702 to 704 each include 64 word drivers 801 for driving word lines WLn (n=1, 5, . . . , 61) to (n=3, 7, . . . , 63). The word line select signals WD in the word driver units 701 to 704 are denoted as WD0 to WD3.

The word drivers 801 adjacent in series in correspondence to the order of word lines WLn are so arranged as not to share the same word line select signal WDn (n=0, 1, 2, 3).

Regarding the semiconductor memory having the above configuration of Embodiment 1, the operation will be discussed.

Figure 15:
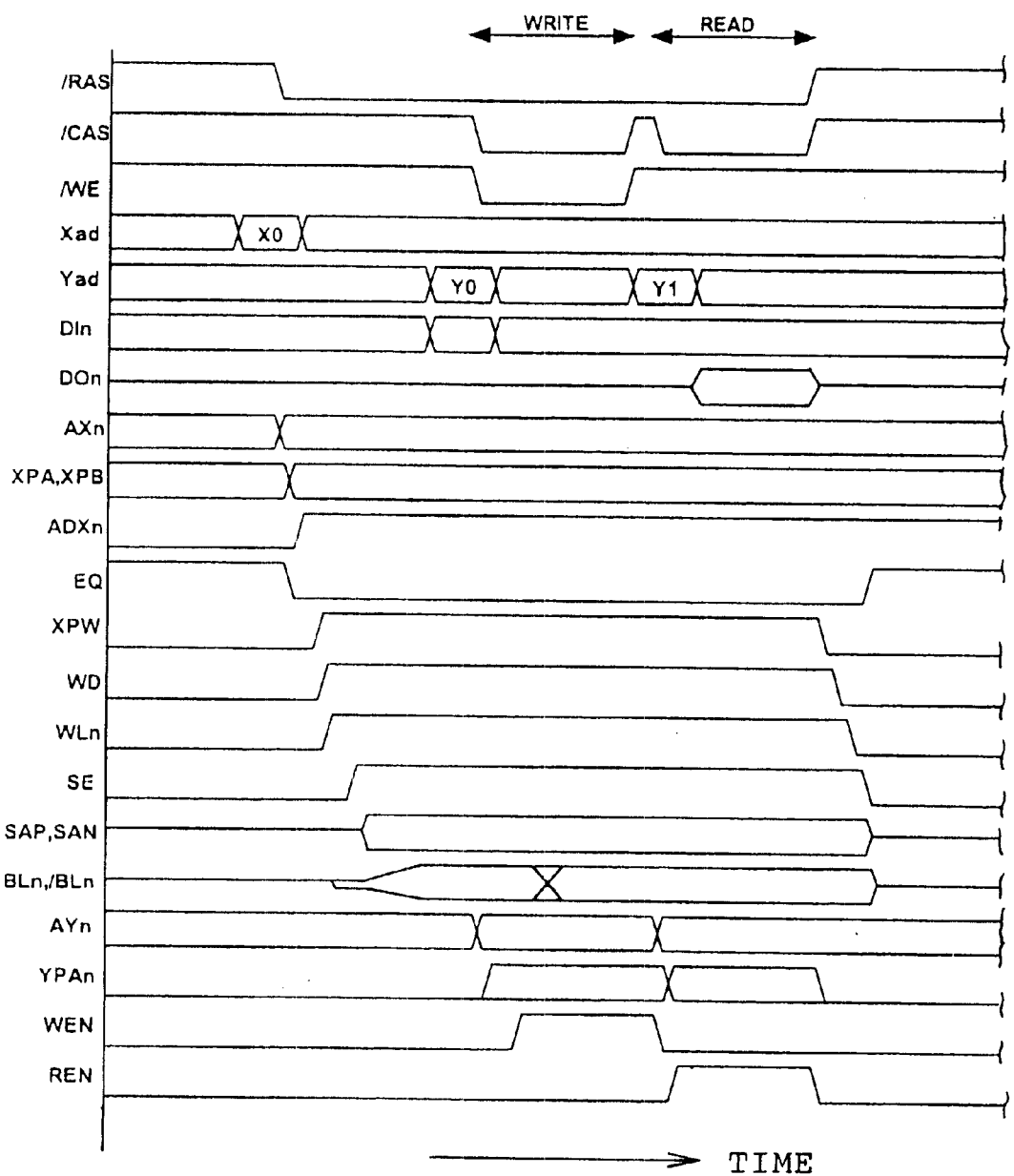
FIG. 15 is a timing chart showing the operation of the semiconductor memory of Embodiment 1.

FIG. 15 is a timing chart showing the operation of the semiconductor memory of Embodiment 1. As shown in FIG. 15, first at a falling edge of the row address strobe signal /RAS, the row address signal Xad is latched by the D-flip flops 301 to 308 and a predetermined row address is outputted to the row address latch signals AX0 to AX7.

Next, in response to the row address latch signals AX0 to AX7, the row controller outputs row predecode signals XPA and XPB. One of the row predecode signals XPA that is determined by the row address latch signals AX2 to 4 is set at a high level and the other signals are set at a low level. Additionally, one of the row predecode signals XPB that is determined by the row address latch signals AX5 to AX7 is set at a high level and the other signals are set at a low level. Further, at a falling edge of the row address strobe signal /RAS, the primary bit line equalize signal PEQ is set at a low level.

When the primary bit line equalize signal PEQ is set at a low level, the bit line precharge signal EQ is set at a low level from the inside of the sense amplifier driver.

When the bit line precharge signal EQ is set at a low level, the sense amplifier power source SAP and sense amplifier ground SAN are subjected to floating. Moreover, the precharge circuit 605 connecting to the bit line pair of BLn and /BLn is deactivated.

Further, in response to the row predecode signals XPA and XPB, a predetermined row decode signal ADXn is set at a high level and a predetermined row decode signal /ADXn is set at a low level. In the four word drivers 801 connecting to the row decode signals, the gate of the N-channel transistor 807 increases in potential to the first power source VDD. Moreover, the gate of the N-channel transistor 803 is set at a ground level and the N-channel transistor 803 is turned off.

Meanwhile, since the word line predecode signals XPW0 to XPW3 are at a low level, the N-channel transistor 811 is turned off, the N-channel transistor 813 is turned on, and the source of the N-channel transistor 813 is at a ground level. Thus, the drain of the P-channel transistor 810, that is, the input of the buffer 814 is at a ground level. In this case, the word line select signal WD is at a ground level and the word line select signal /WD is equal in potential to the second power source VPP.

At this moment, four word lines WLn to WLn+3, which are connected to the four word drivers 801 connected to the predetermined row decode signals ADXn and /ADXn, are kept at a ground level by the N-channel transistor 805 whose gate is connected to the word line select signal /WD.

And then, from when the primary bit line equalize signal PEQ is set at a low level to the end of a time period determined by the third delay element 407, one of the word line predecode signals XPW0 to XPW3 that is determined by the row address latch signals AX0 to AX1 is set at a high level, and the other signals are set at a low level.

The word line select signal /WD and the word line select signal WD are respectively charged to a ground level and a level of the second power source VPP. The word line select signals /WD and WD are outputs of the level shifter 802 connected to a high-level signal of the word line predecode signals XPW0 to XPW3.

At this moment, a time period is necessary for charging at a high level the gates of the 64 P-channel transistors 808 that are connected to the word line select signal WD. The P-channel transistor 808 is small in gate width and has a gate oxide film with a large thickness. Hence, driving is possible at high speeds (about 0.1 ns at the maximum).

Additionally, a time period is necessary for charging at a low level the gates of the 64 N-channel transistors 805 and the drains of the 64 N-channel transistors 807 that are connected to the word line select signal /WD. Since the N-channel transistor 805 has the gate oxide film with a large thickness, driving is possible at high speeds (about 0.2 ns at the maximum).

When the word line select signal /WD is set at a low level, since the N-channel transistor 807 is turned on, the node /WLC of the single word driver 801, which is connected to the predetermined row decode signals ADXn and /ADXn, is set at a low level. Hence, the P-channel transistor 804 is turned on, the word line WLn is charged to a potential of the second power source VPP. At this moment, the P-channel transistor 804 is relatively large in gate width, and the metal wire makes the supply to the source. Consequently, high-speed charging can be carried out with a low impedance.

It takes 3 ns or lower from a falling edge of the row address strobe signal /RAS to the determination of a potential of the word line WLn.

When the word line WLn is charged to a potential of the second power source VPP, the N-channel transistor 602 of the predetermined memory cell 601 to be connected is turned on, and a potential of the capacitor 603 is read by the bit line BLn, which is connected to the memory cell 601.

From a falling edge of the row address strobe signal /RAS to the end of a time period determined by the first delay element 402 and the second delay element 404, the Pch sense amplifier startup signal /SE is set at a low level and the Nch sense amplifier signal SE is set at a high level.

The total delay time of the first delay element 402 and the second delay element 404 is set at a time period from a falling edge of the row address strobe signal /RAS, to the determination of a potential of the word line WLn, and to when data is sufficiently read into the bit line BLn.

When the Pch sense amplifier startup signal /SE is set at a low level and the Nch sense amplifier startup signal is set at a high level, the P-channel transistor 907 and the N-channel transistor 908 in the sense amplifier driver are turned on, a voltage of the first source VDD is set at the sense amplifier power source SAP, and the sense amplifier ground level SAN is set at a ground level. In response, the whole sense amplifiers 604 is activated.

The activated sense amplifier 604 charges the connected bit lines BLn and /BLn to a potential of the first power source VDD or a ground level according to a reading potential of the connected bit lines BLn and /BLn.

Subsequently, at a falling edge of the column address strobe signal /CAS, the column address signal Yad is latched by the D-flip flops 309 to 314 and a predetermined column address is outputted to the column address latch signals AY0 to AY5.

In response to the outputted column address latch signals AY0 to AY5, the column predecode signals YPA0 to YPA11 are outputted from the column controller. The predetermined 16 pairs of bit lines BLn and /BLn, which are determined by the outputted column predecode signals YPA0 to YPA11, are connected to the 16 data inputs DIn and data outputs DOn.

When the write enable signal /WE is at a low level, in a writing mode, from a falling edge of the column address strobe signal /CAS to the end of the time period of the fourth delay element 504, the light amplifier activation signal WEN is set at a high level. When the light amplifier activation signal WEN is set at a high level, the tristate buffers 1102 and 1103 are activated, and data is written into the memory cell according to the data input DIn.

When the write enable signal /WE is at a high level, in a reading mode, from a falling edge of the column address strobe signal /CAS to the end of the time period of the fourth delay element 504, the lead amplifier activation signal REN is set at a high level. When the lead amplifier activation signal REN is set at a high level, the tristate buffer 1104 is activated, and the memory cell data is outputted to the data output DOn.

When the row address strobe signal /RAS and the column address strobe signal /CAS are set at a high level, the column predecode signals YPA0 to YPA11 are set at a low level and the data input DIn and the data output DOn are cut from the bit lines BLn and /BLn. Further, the word line predecode signals XPW0 to XPW3 are all set at a low level.

When the word line predecode signals XPW0 to XPW3 are set at a low level, the word line select signal WD, which is the output of the connected level shifter 802, is set at a ground level, and the word line select signal /WD is charged to a voltage of the second power source VPP.

When the word line select signal WD is set at a ground level, the P-channel transistor 808 is turned on and the node /WLC is set at a high level. When the node /WLC is set at a high level, the P-channel transistor 804 is turned off.

When the word line select signal /WD is charged to a voltage of the second power source VPP, the N-channel transistor 805 is turned on, and the activated word line WLn is discharged to a ground level.

When the word line WLn is at a ground level, the N-channel transistor 602 of the memory cell 601 connected to the word line WLn is turned off, and the charge is stored in the capacitor.

From a rising edge of the row address strobe signal /RAS to the end of the time period determined by the first delay element 402, the primary bit line equalize signal PEQ is set at a high level, and the bit line precharge signal EQ is set at a high level from the inside of the sense amplifier driver. At the same time, the Pch sense amplifier startup signal /SE is set at a high level, the Nch sense amplifier startup signal SE is set at a low level, and the sense amplifier 604 is deactivated. Moreover, when the bit line precharge signal EQ is set at a high level, the bit line pair of BLn and /BLn has an intermediate potential between the first power source VDD and a ground level.

As described above, according to the semiconductor memory of Embodiment 1, the word driver for driving the word line WLn is constituted by the single-stage row decoder and the single-stage word driver group. Additionally, as compared with the conventional art having the word drivers disposed hierarchically in two stages, the configuration includes the level shifter 802 and the single-stage word drivers 801. Thus, only a single stage of the P-channel transistors is disposed between the second power source VPP and the word line WLn with a low impedance, so that high-speed charging can be performed on the word line WLn.

Also, according to the above configuration, only the gate of the P-channel transistor 808 having a small gate width is connected to the word line select signal WD, which is the output of the level shifter 802. Further, only the drain of the N-channel transistor 807, which is relatively small in size, and the gate of the N-channel transistor 805 are connected to the word line select signal /WD. Thus, the load can be reduced, thereby shortening a time period from the input of the word line predecode signals XPW0 to XPW3 to the activation of the word drivers 801.

Additionally, since the word drivers 801 selected by the same word line select signal WD are not adjacent to each other, it is possible to reduce the influence of the coupling, and the N-channel transistor 803 can decrease in size. Consequently, the layout area can be smaller.

(Embodiment 2)

The following will discuss a semiconductor memory according to Embodiment 2 of the present invention.

Figure 16:
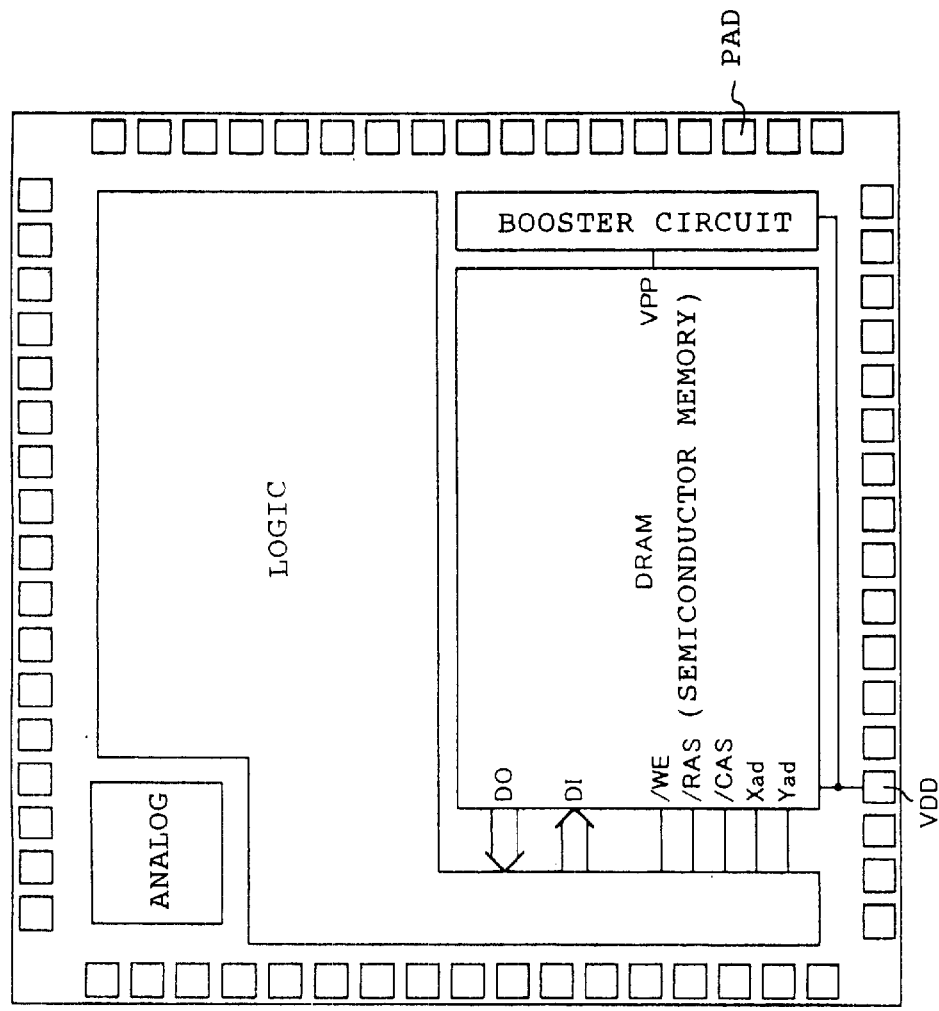
FIG. 16 is a diagram showing a chip of a semiconductor integrated circuit including a semiconductor memory according to Embodiment 2 of the present invention.

FIG. 16 is a diagram showing a chip of a semiconductor integrated circuit including the semiconductor memory of the Embodiment 2. FIG. 16 is different from FIG. 1 in that a booster circuit is provided.

In the semiconductor memory of Embodiment 2 configured as above, the booster circuit generates the second power source VPP from the first power source VDD. Hence, only a single power source is enough to provide supply from the outside.

(Embodiment 3)

The following will discuss a semiconductor memory according to Embodiment 3 of the present invention.

Figure 17:
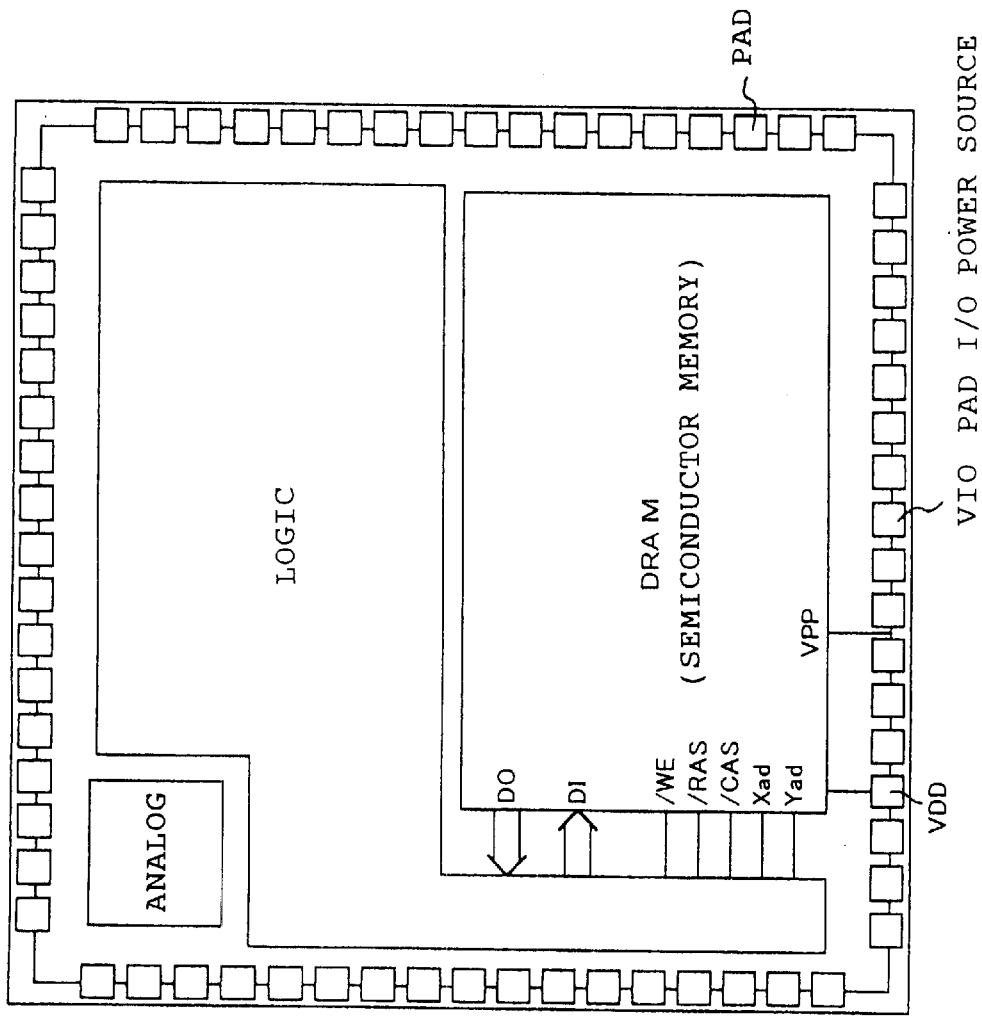
FIG. 17 is a diagram showing a chip of the semiconductor integrated circuit including a semiconductor memory according to Embodiment 3 of the present invention.
Figure 18:
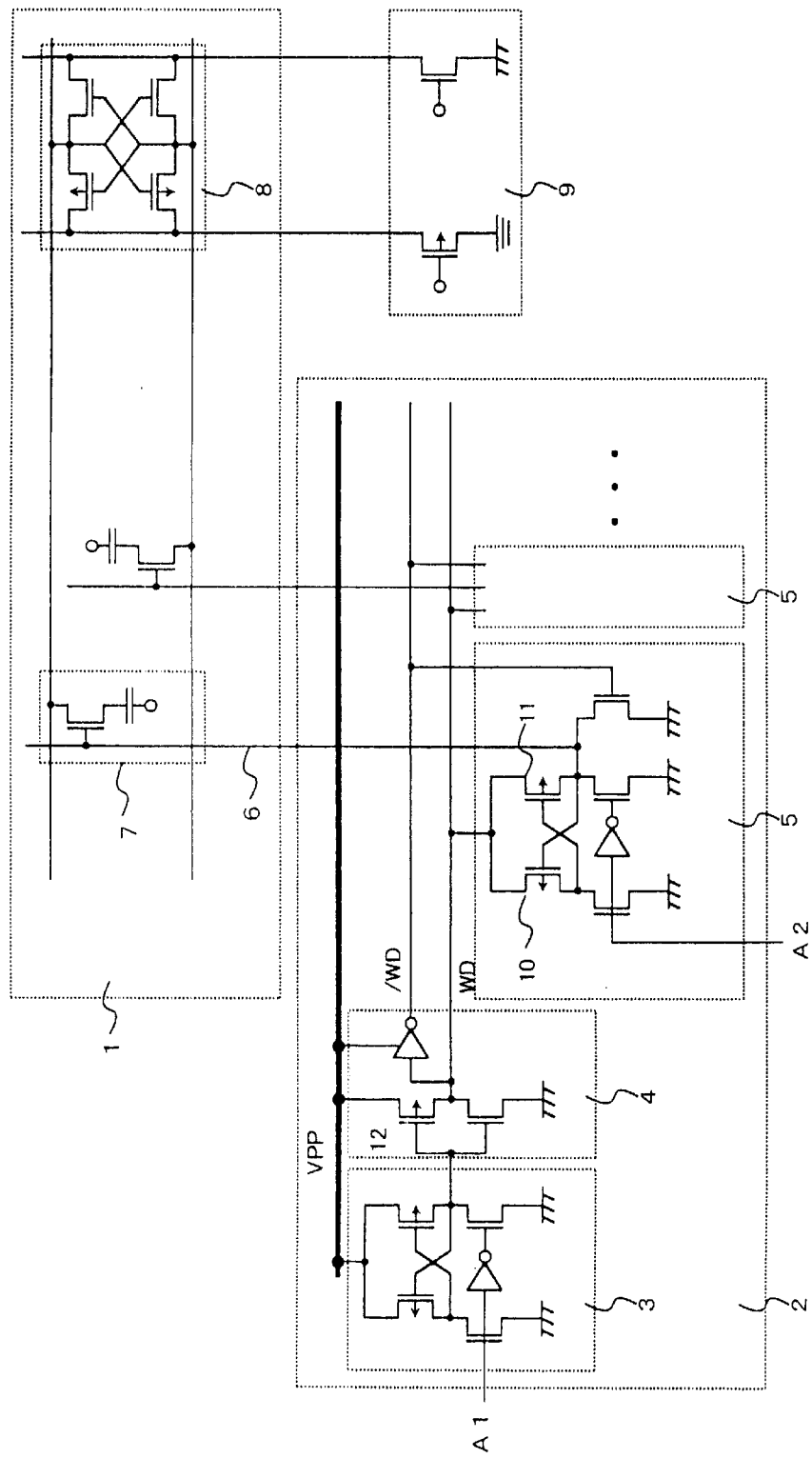
FIG. 18 is a circuit diagram showing a conventional semiconductor memory.

FIG. 17 is a diagram showing a chip of a semiconductor integrated circuit including the semiconductor memory of Embodiment 3. FIG. 17 is different from FIG. 1 in that the supply of the second power source VPP is shared by a pad I/O power source VIO, which is supplied to the pad. The. pad I/O power source VIO is provided for supplying a power source used for the input/output buffer of the I/O pad.

In the semiconductor memory of Embodiment 3 configured as above, since the second power source VPP is shared by the pad I/O power source VIO, it is possible to reduce a power source supplied from the outside.

Additionally, the above embodiments are configured such that the semiconductor memory is placed on a single chip together with logic (logic circuit) and an analog circuit. However, only the semiconductor memory may be placed on the chip, and the data output DOm and the data input DIm may be directly connected to the pad.

Also, the configuration may include only the semiconductor memory and logic (logic circuit), or only the semiconductor memory and the analog circuit.

Further, although the row address signal consists of 8 bits, more bits may be included. In this case, more word driver units may be provided.

Moreover, although the data input DIm and the data output DOm each consist of 16 bits, any bits are applicable. In this case, the configuration of the column decoder and the bit configuration of the column address single are changed if necessary.

What is claimed is:

1. A semiconductor memory, in which a memory array comprising a plurality of bit line pairs driven by a signal based on data, a plurality of word lines driven by a signal based on an address, and memory cells placed on intersections thereof is supplied with a signal based on said data and said address, and said plurality of bit line pairs and said plurality of word lines are driven so that said data is written into said memory cells via said plurality of bit line pairs, said semiconductor memory comprising:

a plurality of level shifters for producing a first select signal, which vary in voltage level between a first source voltage and a ground in response to a first address signal, and are activated at a ground level to select one of said word lines; and a plurality of word drivers for driving a selected one of said plurality of word lines in response to said first select signal;

each of said word drivers comprising:
      a first transistor of a first conductivity type inserted between an associated word line and a power line for supplying said first source voltage; and
      a second transistor of a second conductivity type inserted between said associated word line and the ground,
      said first select signal being inputted to a gate of said first transistor via a switch controlled by a second address signal different from said first address signal, and being inputted to a gate of said second transistor.

2. The semiconductor memory according to claim 1, wherein said level shifter further produces a second select signal with a polarity opposite to said first select signal, a voltage level of said second select signal varying between said first source voltage and the ground, wherein each of said word drivers further comprises:
      a third transistor of said first conductivity type having a source connected to said source line, a drain connected to a gate of said first transistor, and a gate connected to said associated word line;
      a fourth transistor of said first conductivity type having a source connected to said source line, a drain connected to the gate of said first transistor, and a gate receiving said second select signal; and
      a fifth transistor of said second conductivity type having a source connected to the ground, a drain connected to said associated word line, and a gate receiving a third address signal with a polarity opposite to said second address signal, wherein said switch comprises:
      a sixth transistor of said second conductivity type having a source receiving said first select signal, a gate receiving said second address signal, and a drain connected to the gate of said first transistor.

3. The semiconductor memory according to claim 2, wherein said third transistor of said first conductivity type has a gate width one tenth of or less than that of said first transistor of said first conductivity type.

4. The semiconductor memory according to claim 2, wherein said fourth transistor of said first conductivity type has a gate width one tenth of or less than that of said first transistor of said first conductivity type.

5. The semiconductor memory according to claim 1, wherein said plurality of word drivers are arranged such that the word lines selected and driven by the same level shifter from said plurality of level shifters are not adjacent to each other.

6. The semiconductor memory according to claim 1, wherein said first power source is exclusively supplied from the outside of the chip.

7. The semiconductor memory according to claim 1, wherein said first power source is supplied by boosting a second power source with a booster circuit provided in the chip, said second power source supplying a voltage lower than that of said first power source to another circuits such as a control circuit.

8. The semiconductor memory according to claim 1, wherein said first power source is the same as a power source supplied to an I/O pad.

* * * * *